(12) United States Patent
Shin et al.

(10) Patent No.: US 11,574,905 B2
(45) Date of Patent: Feb. 7, 2023

(54) RESISTOR WITH DOPED REGIONS AND SEMICONDUCTOR DEVICES HAVING THE SAME

(71) Applicant: SAMSUNG ELECTRONICS CO., LTD., Suwon-si (KR)

(72) Inventors: Woocheol Shin, Seoul (KR); Myunggil Kang, Suwon-si (KR); Minyi Kim, Hwaseong-si (KR); Sanghoon Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/371,494

(22) Filed: Jul. 9, 2021

(65) Prior Publication Data

US 2021/0335779 A1 Oct. 28, 2021

Related U.S. Application Data

(63) Continuation of application No. 16/784,788, filed on Feb. 7, 2020, now Pat. No. 11,075,197.

(30) Foreign Application Priority Data

Jul. 22, 2019 (KR) .................. 10-2019-0088382

(51) Int. Cl.
*H01L 21/00* (2006.01)
*H01L 27/06* (2006.01)
*H01L 21/8234* (2006.01)

(52) U.S. Cl.
CPC .. *H01L 27/0629* (2013.01); *H01L 21/823431* (2013.01); *H01L 21/823481* (2013.01)

(58) Field of Classification Search
CPC ......... H01L 27/0629; H01L 21/823431; H01L 27/823481
See application file for complete search history.

(56) References Cited

U.S. PATENT DOCUMENTS

| | | | | |
|---|---|---|---|---|
| 8,981,480 | B2* | 3/2015 | Lim | H01L 27/10894 257/349 |
| 9,035,425 | B2* | 5/2015 | Tsao | H01L 27/0611 257/536 |
| 9,373,619 | B2* | 6/2016 | Su | H01L 29/405 |
| 10,128,145 | B2* | 11/2018 | Benaissa | H01L 27/0802 |
| 10,381,345 | B2* | 8/2019 | Shin | H01L 21/76831 |
| 11,075,197 | B2* | 7/2021 | Shin | H01L 29/66166 |
| 11,367,796 | B2* | 6/2022 | Guha | H01L 21/823456 |

(Continued)

FOREIGN PATENT DOCUMENTS

| KR | 10-2004-0059456 | 7/2004 | |
|---|---|---|---|
| WO | WO-2013103973 A1 * | 7/2013 | ............... A61P 25/00 |

*Primary Examiner* — Laura M Menz
(74) *Attorney, Agent, or Firm* — F. Chau & Associates, LLC

(57) ABSTRACT

A resistor including a device isolation layer is described that includes a first active region and a second active region, a buried insulating layer, and an N well region. The N well region surrounds the first active region, the second active region, the device isolation layer and the buried insulating layer. A first doped region and a second doped region are disposed on the first active region and the second active region. The first doped region and the second doped region are in contact with the N well region and include n type impurities.

20 Claims, 21 Drawing Sheets

(56) References Cited

U.S. PATENT DOCUMENTS

| | | | |
|---|---|---|---|
| 2006/0113547 A1* | 6/2006 | Shin | H01L 27/11531 257/77 |
| 2006/0118885 A1* | 6/2006 | Song | H01L 27/10894 257/532 |
| 2007/0001232 A1* | 1/2007 | King | H01L 29/7843 257/E21.703 |
| 2007/0001237 A1* | 1/2007 | King | H01L 29/785 257/E21.633 |
| 2007/0004113 A1* | 1/2007 | King | H01L 21/845 257/E21.628 |
| 2007/0120156 A1* | 5/2007 | Liu | H01L 29/66795 257/288 |
| 2007/0122953 A1* | 5/2007 | Liu | H01L 27/0207 257/256 |
| 2007/0122954 A1* | 5/2007 | Liu | H01L 27/0207 257/E21.633 |
| 2007/0128782 A1* | 6/2007 | Liu | H01L 21/76224 257/E21.633 |
| 2008/0099753 A1* | 5/2008 | Song | H01L 45/126 257/E47.001 |
| 2008/0247103 A1* | 10/2008 | Kim | H01L 27/0285 361/56 |
| 2012/0049256 A1* | 3/2012 | Lim | H01L 21/823481 257/E27.06 |
| 2012/0228686 A1* | 9/2012 | Inoue | H01L 27/0629 257/E21.409 |
| 2013/0032862 A1* | 2/2013 | Su | H01L 28/20 257/272 |
| 2014/0167180 A1* | 6/2014 | Xiong | H01L 27/0629 257/379 |
| 2014/0227859 A1* | 8/2014 | Benaissa | H01L 29/8605 438/433 |
| 2014/0327074 A1* | 11/2014 | Tsao | H01L 27/0629 257/379 |
| 2015/0146330 A1 | 5/2015 | Appaswamy et al. | |
| 2015/0148330 A1* | 5/2015 | Cisar | C07D 413/10 514/254.01 |
| 2016/0163815 A1* | 6/2016 | Hoentschel | H01L 29/7834 438/682 |
| 2017/0141102 A1* | 5/2017 | Basker | H01L 29/66795 |
| 2018/0211952 A1* | 7/2018 | Shin | H01L 27/0629 |
| 2019/0043864 A1 | 2/2019 | Takesako et al. | |
| 2019/0043884 A1* | 2/2019 | Zhu | H01L 29/40117 |
| 2019/0057898 A1* | 2/2019 | Shim | H01L 21/76264 |
| 2019/0067113 A1* | 2/2019 | Chiang | H01L 27/0886 |
| 2019/0157283 A1* | 5/2019 | Jung | H01L 27/1157 |
| 2019/0164841 A1* | 5/2019 | St. Amour | H01L 21/823807 |
| 2019/0181226 A1* | 6/2019 | Choi | H01L 29/42368 |
| 2019/0304991 A1* | 10/2019 | Seo | H01L 27/11565 |
| 2020/0043914 A1* | 2/2020 | Olac-Vaw | H01L 21/823481 |
| 2020/0126858 A1* | 4/2020 | Gwak | H01L 21/76831 |
| 2020/0212061 A1* | 7/2020 | Choi | H01L 29/04 |
| 2020/0286890 A1* | 9/2020 | Subramanian | H01L 29/66795 |
| 2020/0286891 A1* | 9/2020 | Subramanian | H01L 21/3088 |
| 2020/0287015 A1* | 9/2020 | Subramanian | H01L 21/823475 |
| 2021/0028164 A1* | 1/2021 | Shin | H01L 29/78696 |
| 2021/0057419 A1* | 2/2021 | Shin | H01L 27/10805 |
| 2021/0057533 A1* | 2/2021 | Hwang | H01L 23/5226 |
| 2021/0066276 A1* | 3/2021 | Kim | H01L 24/80 |
| 2021/0066320 A1* | 3/2021 | Kim | H01L 27/11286 |
| 2021/0074716 A1* | 3/2021 | Lim | H01L 27/11519 |
| 2021/0175230 A1* | 6/2021 | Shin | H01L 21/02603 |
| 2021/0335779 A1* | 10/2021 | Shin | H01L 29/66166 |
| 2022/0045051 A1* | 2/2022 | You | H01L 21/823437 |
| 2022/0122965 A1* | 4/2022 | Shin | H01L 29/66545 |

\* cited by examiner

RESISTOR WITH DOPED REGIONS AND SEMICONDUCTOR DEVICES HAVING THE SAME

CROSS-REFERENCE TO RELATED APPLICATION

This application claims from Korean Patent Application No. 10-2019-0088382, filed on Jul. 22, 2019, and U.S. patent Ser. No. 16/784,788 filed on Feb. 7, 2020, the disclosures of which are incorporated herein by reference in their entirety.

BACKGROUND

1. Field

Devices consistent with example embodiments relate to a resistor with a doped region and a semiconductor device having the same.

2. Description of Related Art

Electronic devices may include one or more semiconductor devices components. Applications that use semiconductor devices include smart phones, tablet computers, and cameras. A transistor is an example of a semiconductor device, and is used to amplify or modify electronic signals.

Demand for smaller electronic devices is increasing. As a result, demand for smaller semiconductor devices that do not compromise performance transistors is also increasing. However, reducing the size of a semiconductor device such as transistor can cause short channel effects such as drain-induced barrier lowering, velocity saturation, and hot carrier degradation. Therefore, there is a need in the art to provide for semiconductor devices that reduce the likelihood of short channel effects in a circuit.

SUMMARY

Example embodiments of inventive concepts are directed to providing a semiconductor device with a resistor in a surrounding gate structure.

According to some example embodiments, a resistor may include a first active region and a second active region each extending in a first horizontal direction, the first active region and the second active region being spaced apart from each other along the first horizontal direction; a device isolation layer contacting the first active region and the second active region; a buried insulating layer disposed between the first active region and the second active region; an N well region formed in a substrate, the N well region surrounding the first active region, the second active region, the device isolation layer and the buried insulating layer; a plurality of channel layers stacked on the first active region and the second active region, the plurality of channel layers being spaced apart from each other in a vertical direction; first gate electrodes surrounding the plurality of the channel layers, the first gate electrodes extending along a second horizontal direction intersecting with the first horizontal direction; a doped region comprising a first doped region and a second doped region each disposed on side surfaces of the first gate electrodes above the first active region and the second active region, respectively, in the vertical direction, the first doped region and the second doped region in contact with the N well region and including n type impurities; a plurality of contact plugs in contact with upper surfaces of the first doped region and the second doped region.

According to some example embodiments, a semiconductor device may include a substrate comprising a resistor region and a transistor region; an N well region disposed on the resistor region; a first active region and a second active region each extending in a first horizontal direction, the first active region and the second active region being spaced apart from each other along the first horizontal direction; a first device isolation layer contacting the first active region and the second active region; a buried insulating layer disposed between the first active region and the second active region; a plurality of channel layers stacked on the first active region and the second active region, the plurality of channel layers being spaced apart from each other in a vertical direction; gate electrodes surrounding the plurality of the first channel layers on at least two opposite sides, the gate electrodes extending along a second horizontal direction intersecting with the first horizontal direction; a first doped region and a second doped region each disposed on side surfaces of the gate electrodes on the first active region and the second active region, the first doped region and the second doped region in contact with the N well region and including n impurities; a plurality of contact plugs in contact with upper surfaces of the first doped region and the second doped region.

According to some example embodiments, a resistor may include an active region comprising a first active region and a second active region each extending in a first horizontal direction, the first active region and the second active region being spaced apart from each other along the first horizontal direction; a device isolation layer contacting the first active region and the second active region; a buried insulating layer disposed between the first active region and the second active region and formed deeper than the device isolation layer; an N well region formed in a substrate; the N well region surrounding the first region, the second active region, the device isolation layer and the buried insulating layer; a plurality of channel layers stacked on the first active region and the second active region, the plurality of channel layers being spaced apart from each other in a vertical direction; gate electrodes surrounding the plurality of the channel layers on at least two opposite sides, the gate electrodes extending along a second horizontal direction intersecting with the first horizontal direction; a doped region comprising a first doped region and a second doped region each disposed on side surfaces of the gate electrodes on the first active region and the second active region, the first doped region and the second doped region in contact with the N well region and including n impurities; inner spacers in contact with a side surface of the doped region and disposed on lower surfaces of the plurality of channel layers; gate spacers disposed on the active region and the plurality of the channel layers, the gate spacers covering the side surfaces of the gate spacers; an interlayer insulating layer covering the device isolation layer, the buried insulating layer, the gate spacers, the first doped region, and the second doped region; a plurality of contact plugs in contact with the first doped region and the second doped region, the plurality of contact plugs penetrating the interlayer insulating layer.

BRIEF DESCRIPTION OF THE DRAWINGS

The above and other objects, features, and advantages of inventive concepts will become more apparent to those of ordinary skill in the art by describing exemplary embodiments thereof in detail with reference to the accompanying drawings, in which.

DETAILED DESCRIPTION OF EXEMPLARY EMBODIMENTS

Embodiments of the present disclosure include semiconductor devices that reduce the likelihood of short channel effects in a circuit. For example, a resistor is described that includes a well region divided into two parts by a buried insulating layer and a semiconductor layer epitaxially grown from a silicon substrate. The semiconductor layer may include materials of the same conductivity type as the N well region.

According to an example embodiment, the resistor may be formed simultaneously with a Multi-Bridge Channel Field Effect Transistor (MBCFET). In this case, the multi-bridge channel structure is also applied to the resistor the manufacturing stage of the MBCFET. Additionally, in MBCFET, the width of the channel can be arbitrarily changed. Therefore, a resistor having different resistances can be implemented according to the width of the channel.

Figure 1:
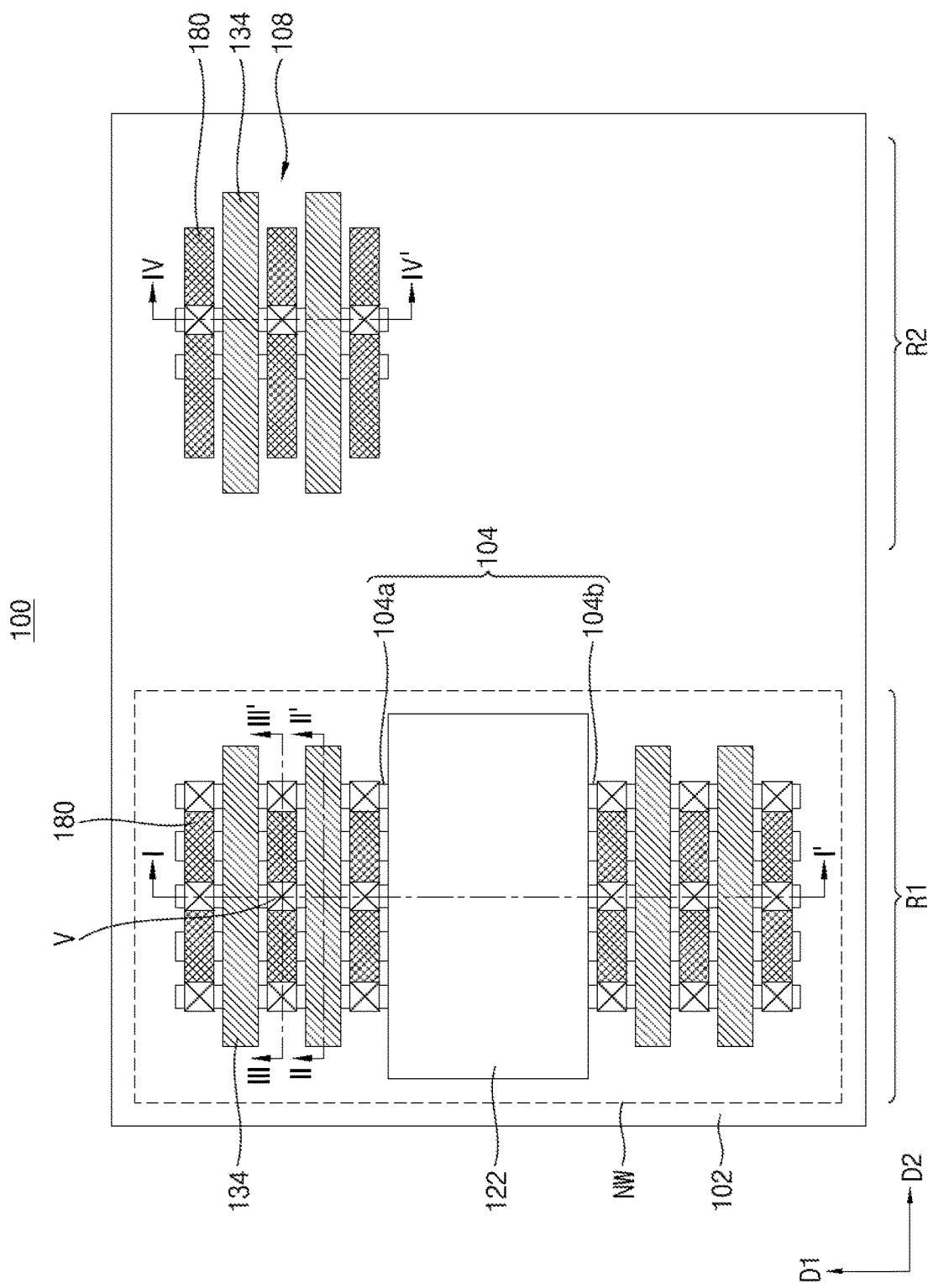
FIG. 1 is a layout of a semiconductor device according to an example embodiment of inventive concepts.

FIG. 1 is a layout of a semiconductor device according to an example embodiment of inventive concepts. FIGS. 2A-2D are vertical cross-sectional views of the semiconductor device of FIG. 1, taken along line I-I', II-II', III-III' and IV-IV', respectively.

Referring to FIG. 1 and FIGS. 2A-2D, a semiconductor device 100 may include a substrate 102, a channel layer 114, a device isolation layer 120, a buried insulating layer 122, a gate electrode 134, a doped region 150, a source/drain region 152, and an interlayer insulating layer 160. The semiconductor device 100 may further include a contact plug 180, a via V, and interconnects L1, L2, L3, L4, L5, L6, and L.

The semiconductor device 100 may include a resistor region R1 and a transistor region R2. The resistor region R1 may include a resistor 106, and the transistor region R2 may include a transistor 108. The resistor 106 includes a first active region 104a, a second active region 104b, an N well region NW below the buried insulating layer 122, a first doped region 150a, and a second doped region 150b. The transistor 108 may include a plurality of channel layers 114, a source/drain region 152, and a gate electrode 134.

Substrate 102 may include a semiconductor material. For example, the substrate 102 may be a silicon substrate, a germanium substrate, a silicon-germanium substrate, or a silicon on insulator (SOI) substrate. In an example embodiment, the substrate 102 may be a P-type semiconductor substrate and may include an N well region NW on top of the resistor region R1 of the substrate 102. Substrate 102 may include device isolation layer 120 defining active region 104. For example, a portion of the substrate 102 located between portions of the device isolation layer 120 may correspond to an active region 104. A plurality of active regions 104 may extend in the first horizontal direction D1 and may be spaced apart from each other along the second horizontal direction D2. The plurality of active regions 104 may include a first active region 104a and a second active region 104b disposed at opposite sides of the buried insulating layer 122.

Figure 2A:
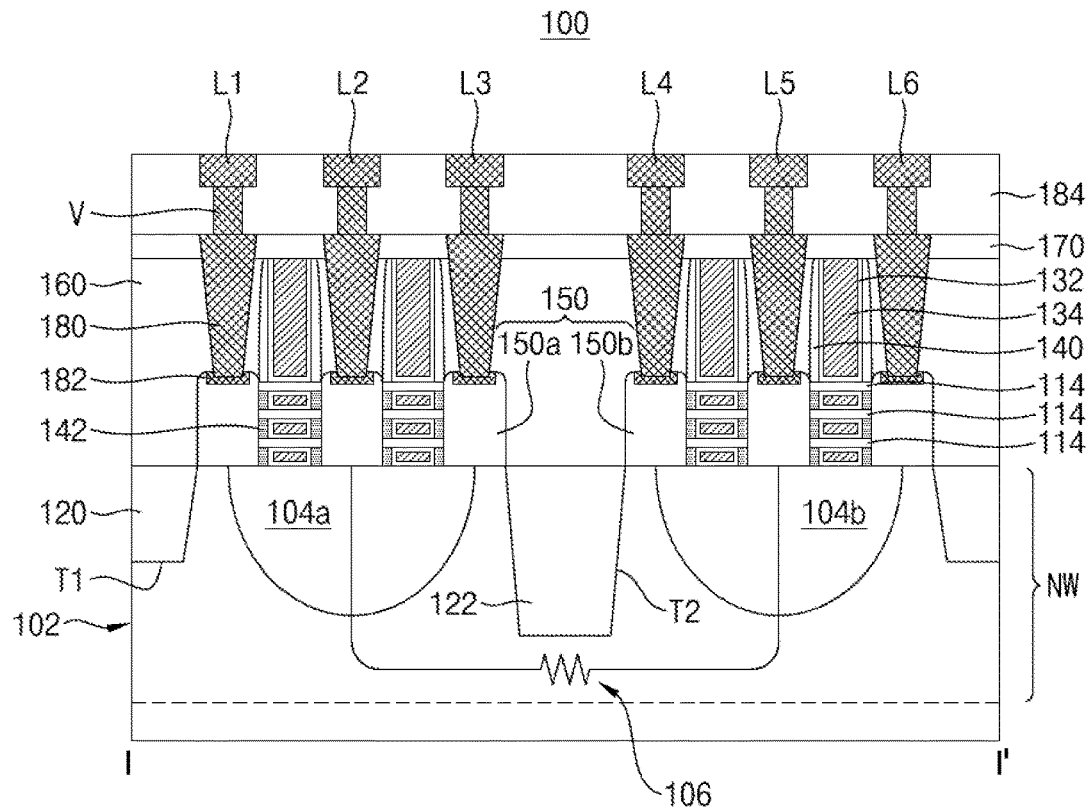
FIGS. 2A-2D are vertical cross-sectional views of the semiconductor device of FIG. 1, taken along line I-I', II-II', III-III' and IV-IV', respectively.
Figure 2B:
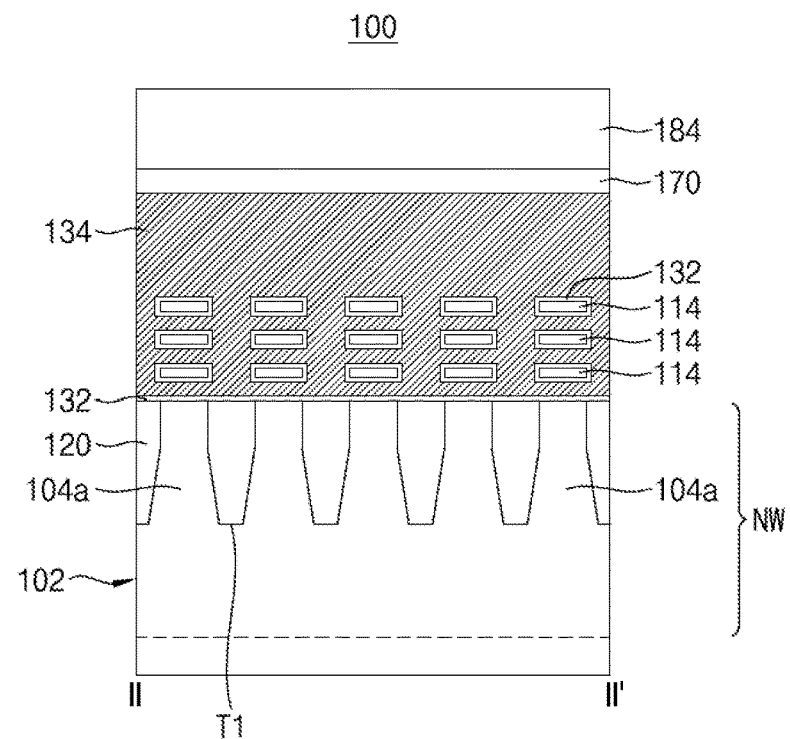
Figure 2C:
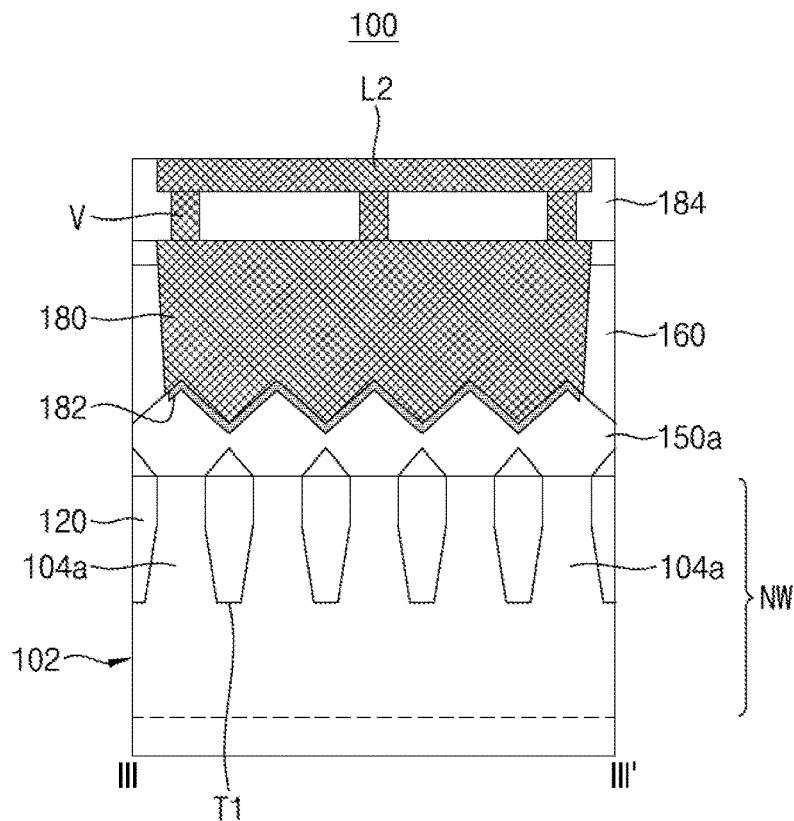
Figure 2D:
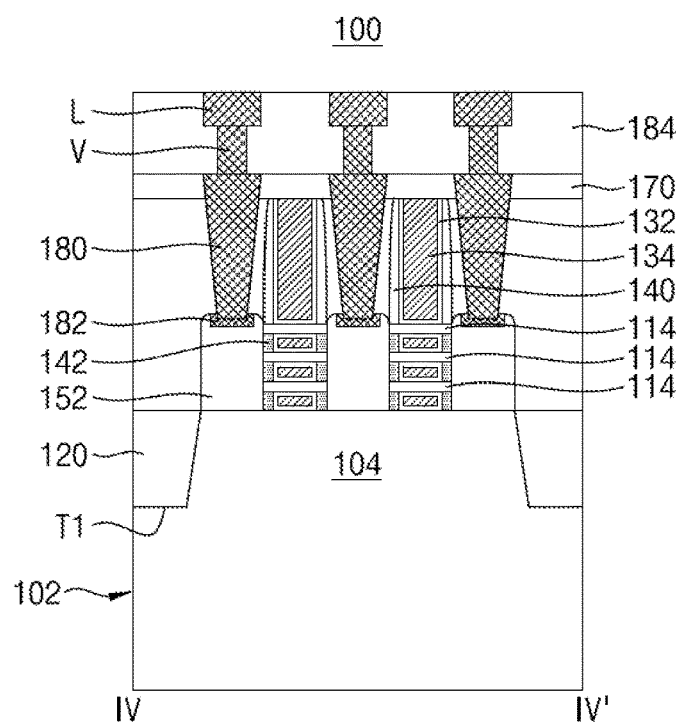

The plurality of channel layers 114 may be stacked spaced apart from each other in a vertical direction on the substrate 102. In FIG. 2B, the channel layer 114 in the form of a nanosheet with a rectangular cross-section is illustrated but is not limited thereto. In an example embodiment, the cross-section of the channel layer 114 may be circular or elliptical. Each channel layer 114 may have a predetermined length along the first horizontal direction D1 and the second horizontal direction D2. In an example embodiment, the channel layer 114 may include one or more of a group IV semiconductor such as Si, Ge, SiGe or a group III-V compound semiconductor such as InGaAs, InAs, GaSb, InSb, or the like.

The device isolation layer 120 may fill the inside of a first trench T1 formed on the substrate 102. The device isolation layer 120 may be disposed between the plurality of active regions 104 and may extend in the first horizontal direction D1. The buried insulating layer 122 may fill the inside of a second trench T2 formed on the substrate 102. The buried insulating layer 122 may be disposed in the middle of the plurality of active regions 104. The second trench T2 may be formed deeper than the first trench T1. The buried insulating layer 122 may not penetrate the N well region NW. For example, the N well region NW may surround a bottom surface of the buried insulating layer 122. A top surface of the active region 104 may be located at a similar level as top surfaces of the device isolation layer 120 and the buried insulating layer 122, respectively. In an example embodiment, device isolation layer 120 and buried insulating layer 122 may comprise silicon oxide, silicon nitride, silicon oxynitride, or a low dielectric constant (low-K) dielectric material.

A gate dielectric layer 132 and the gate electrode 134 may surround the channel layer 114. The gate dielectric layer 132 may extend in the second horizontal direction D2 and cover the top surfaces of the active region 104 and the device isolation layer 120. Additionally, the gate dielectric layer 132 may surround the surface of the channel layer 114. The gate electrode 134 may extend in the second horizontal direction D2 and may cover the channel layer 114 and the gate dielectric layer 132. The gate dielectric layer 132 may include a material with a high dielectric constant (high-k) such as hafnium oxide, hafnium oxy-nitride, or the like. The gate electrode 134 may include aluminum, copper, titanium, tantalum, tungsten, molybdenum, tantalum nitride, nickel silicide, cobalt silicide, TiN, WN, TiAl, TiAlN, TaCN, TaC, TaSiN, metal alloys or combinations thereof. In an example embodiment, the gate electrode 134 may comprise tungsten.

Gate spacers 140 may be disposed outside the gate electrode 134. For example, the gate spacers 140 may be disposed to face each other with the gate electrode 134 interposed therebetween. The gate spacers 140 may extend in the second horizontal direction D2. The gate spacer 140 may be formed of one or more layers.

Inner spacers 142 may be disposed at both sides of the gate electrode 134 along the second horizontal direction D2. The inner spacers 142 may be disposed on a bottom surface of each channel layer 114 and may contact outer surfaces of the doped region 150 and the source/drain region 152, respectively. The inner spacers 142 may electrically separate the gate electrode 134 from the doped region 150 or the source/drain region 152. In an example embodiment, the inner spacers 142 may comprise a silicon nitride material.

The doped region 150 may be disposed on the active region 104 of the resistor region R1 and may be disposed on the side of the gate electrode 134. A plurality of doped regions 150 may include the first doped region 150a and the second doped region 150b disposed at both sides of the buried insulating layer 122. The doped region 150 may be in contact with the N well region NW. The doped region 150 may be doped with the same type of conductive material as the N well region NW. For example, the doped region 150 may include n-type impurities. In an example embodiment, the doped region 150 may include an n-type impurity with a higher concentration than the N well region NW. Since the doped region 150 is doped with the same type of conductive material as the N well region NW, the resistor 106 may not function as a transistor. The first doped region 150a may be electrically connected to the second doped region 150b through first active region 104a, the N well region NW, and the second active region 104b.

The source/drain region 152 may be disposed on the active region 104 of the transistor region R2 and may be disposed on a side of the gate electrode 134. Adjacent source/drain regions 152 may be electrically connected through each channel layer 114. In an example embodiment, the source/drain regions 152 may include n-type impurities.

The interlayer insulating layer 160 may cover the device isolation layer 120, the buried insulating layer 122, the gate spacer 140, the doped region 150, and the source/drain region 152. The interlayer insulating layer 160 may include silicon oxide, silicon nitride, silicon oxynitride, or a low-K dielectric material and may be composed of one or more layers. The low-K dielectric materials may include, for example, Undoped Silica Glass (USG), Borosilica Glass (BSG), PhosphoSilica Glass (PSG), BoroPhosphoSilica Glass (BPSG), Plasma Enhanced Tetra Ethyl Ortho Silicate (PETOS), Fluoride Silicate Glass (FSG) (High Density Plasma) oxide or a combination thereof.

The capping layer 170 may be disposed on the interlayer insulating layer 160. The capping layer 170 may cover top surfaces of the gate electrode 134, the gate spacer 140, and the interlayer insulating layer 160. The capping layer 170 may include silicon oxide, silicon nitride, silicon oxynitride, or a combination thereof.

The contact plug 180 may vertically penetrate the interlayer insulating layer 160 and the capping layer 170 to contact the top surface of the doped region 150 and the source/drain region 152. The contact plug 180 may extend in the second horizontal direction D2 and may have a bar shape. Additionally, the contact plug 180 may be electrically connected to the doped region 150 or the source/drain region 152. A silicide layer 182 may be further disposed below the contact plug 180. Additionally, the silicide layer 182 may be disposed between the doped region 150 and the contact plug 180 and between the source/drain region 152 and the contact plug 180. Although not shown, a diffusion barrier layer surrounding side and bottom surfaces of the contact plug 180 may be disposed. The contact plug 180 may include W, Co, Cu, Al, Ti, Ta, TiN, TaN, or a combination thereof. The silicide layer 182 may include a material in which a silicon material is applied to a portion of the contact plug 180.

A contact insulating layer 184 may be disposed on the capping layer 170. The via V and the interconnects L1, L2, L3, L4, L5, L6, and L may pass through the contact insulating layer 184. The via V may electrically connect the contact plug 180 and the interconnects L1, L2, L3, L4, L5, L6, and L. A plurality of vias V may be connected to a contact plug 180 in the second horizontal direction D2. Each contact plug 180 may be connected to the interconnects L1, L2, L3, L4, L5, and L6 through the vias V. The interconnects L1, L2, and L3 may be electrically connected to each other. The interconnects L4, L5, and L6 may be electrically connected to each other. In an example embodiment, the interconnects L1, L2, L3 and the interconnects L4, L5, L6 may be integrated with each other. The contact insulating layer 184 may include a silicon oxide material. The vias V and the interconnects L1, L2, L3, L4, L5, L6, and L may include W, Co, Cu, Al, or a combination thereof.

As shown in FIG. 1 and FIGS. 2A-2D, the semiconductor device 100 of the present disclosure may implement the resistor 106 in a surrounding gate structure with the channel layer 114 in the form of a nanosheet. Unlike the finFET device, the transistor with the channel layer 114 in the form of a nanosheet may arbitrarily change the width of the channel layer 114. For example, a width of the second horizontal direction D2 of the channel layer 114 shown in FIG. 2B may be arbitrarily changed, and a width of the second horizontal direction D2 of the doped region 150 may also be changed. Therefore, the resistor 106 with various resistances can be implemented.

Figure 3:
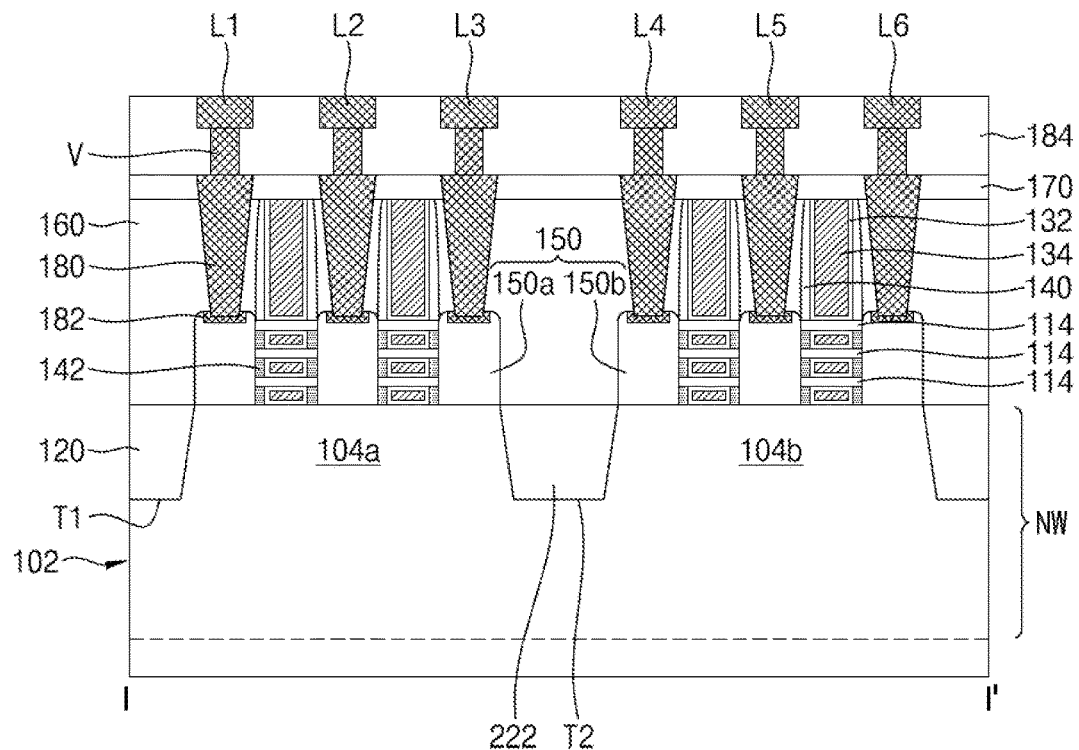
FIG. 3 and FIG. 4 are vertical cross-sectional views of the resistor according to an example embodiment of inventive concepts.
Figure 4:
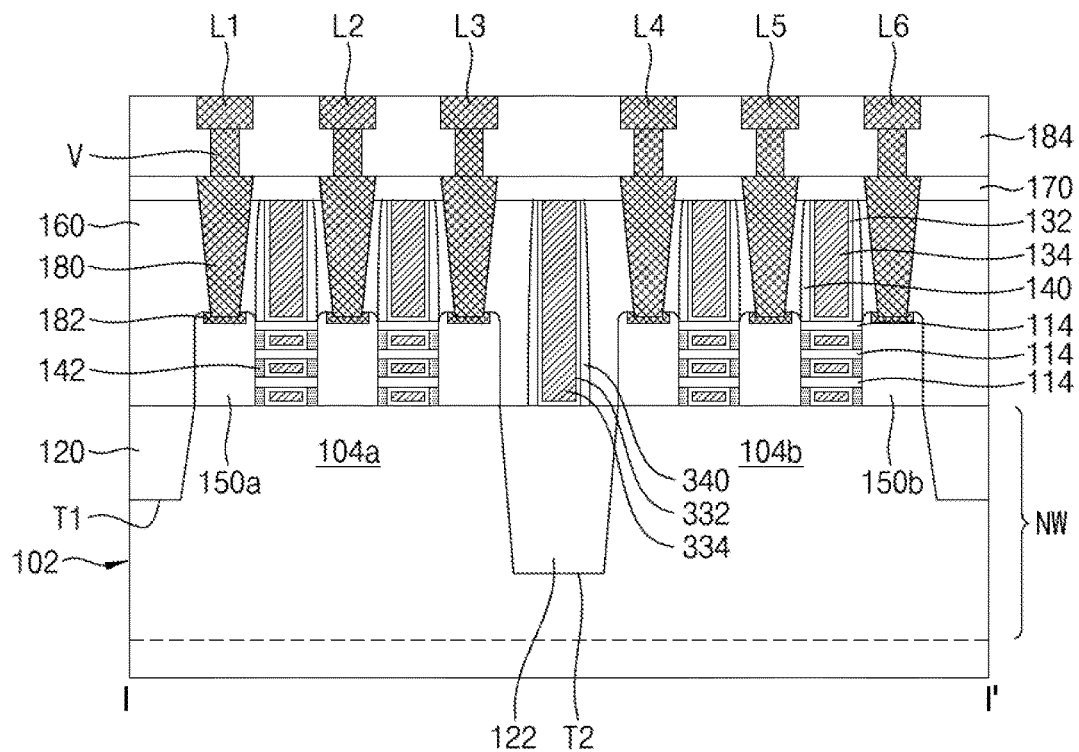
Figure 5A:
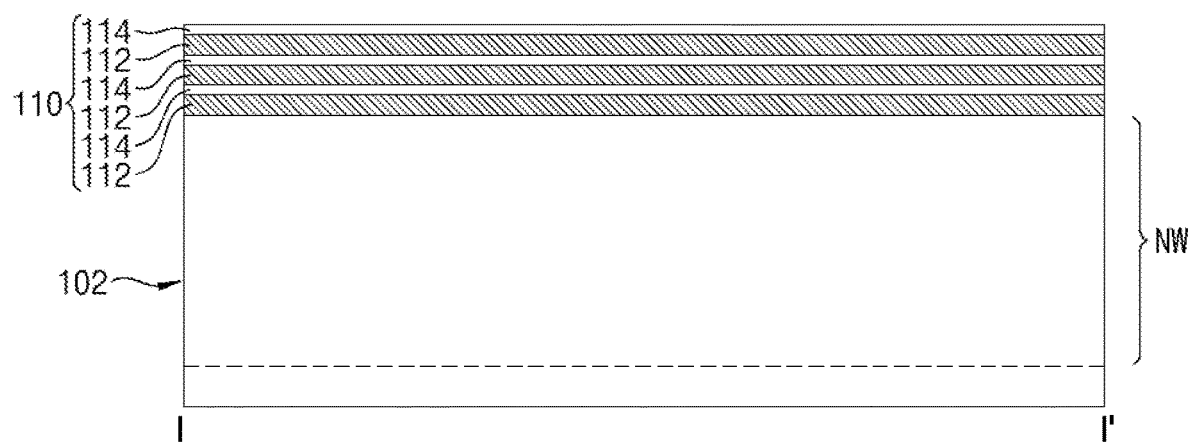
FIGS. 5A-14C are vertical cross-sectional views illustrating in a process order of a method of manufacturing a semiconductor device according to an example embodiment of inventive concepts.
Figure 5B:
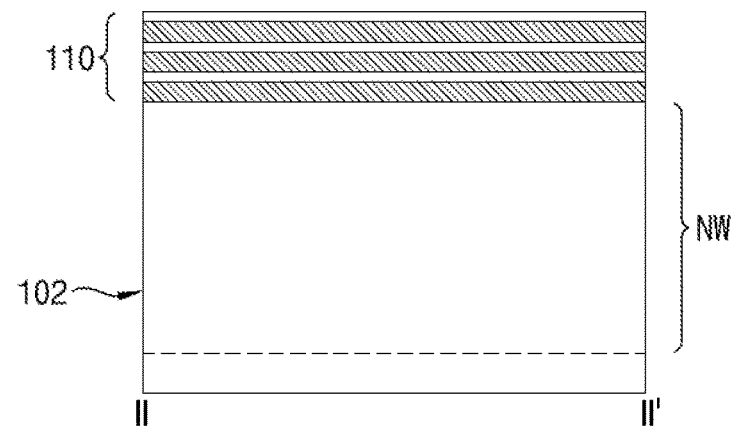
Figure 5C:
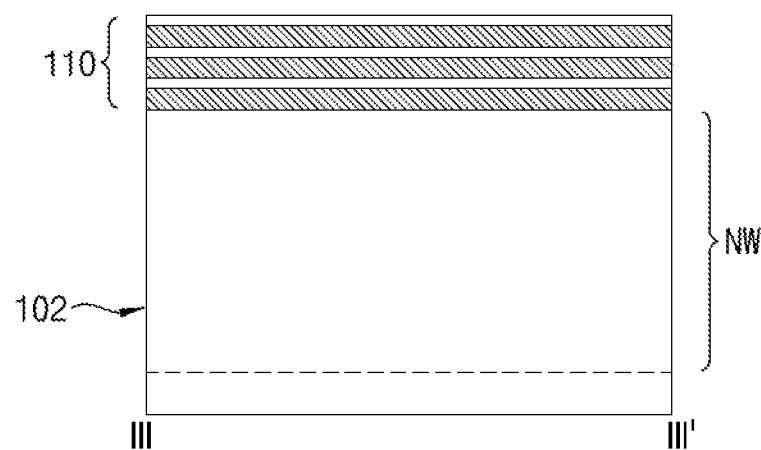
Figure 5D:
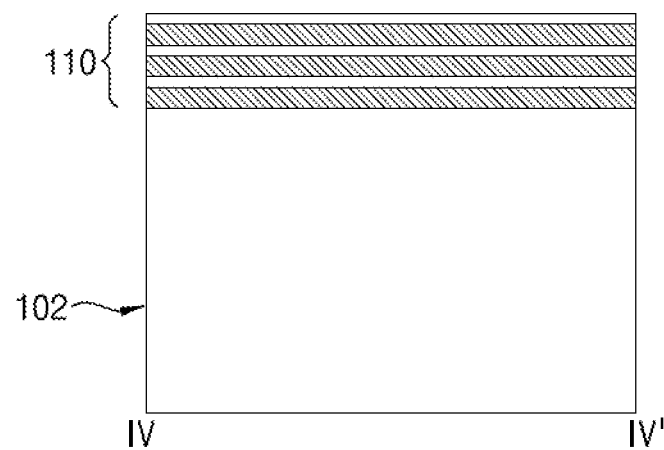
Figure 6A:
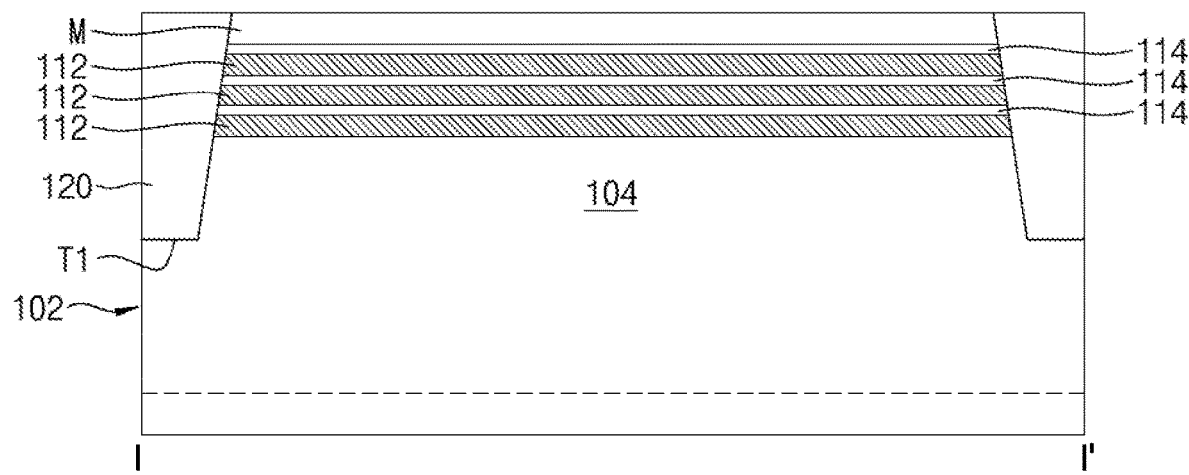
Figure 6B:
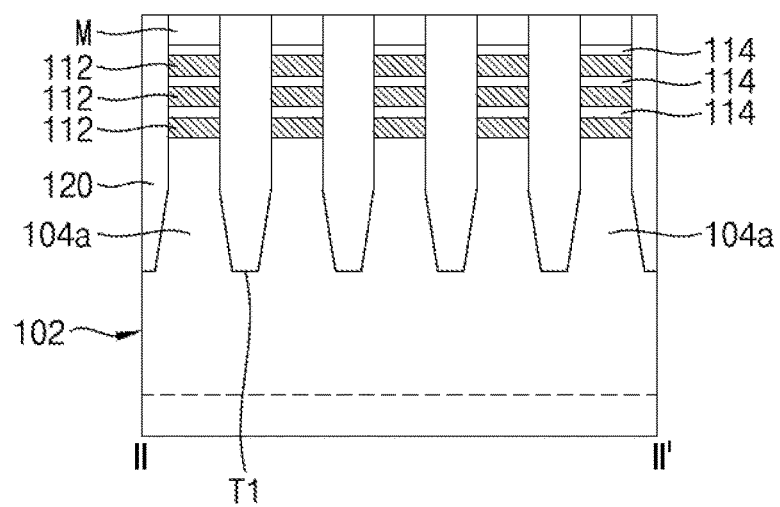
Figure 6C:
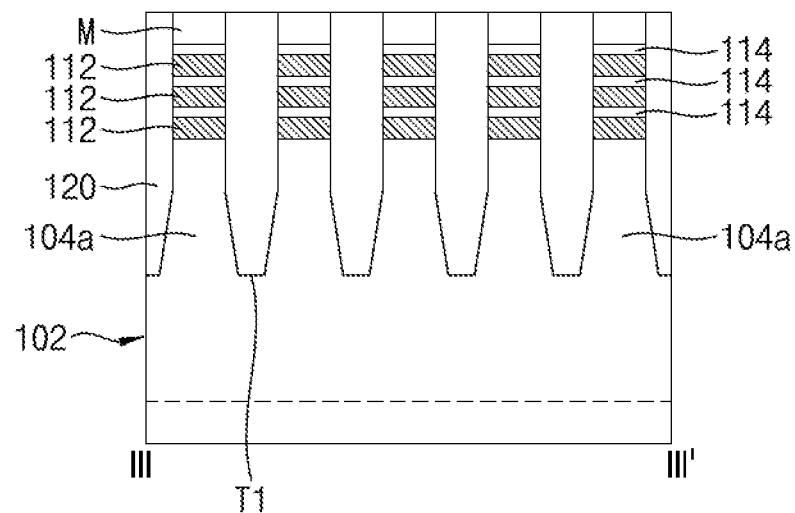
Figure 6D:
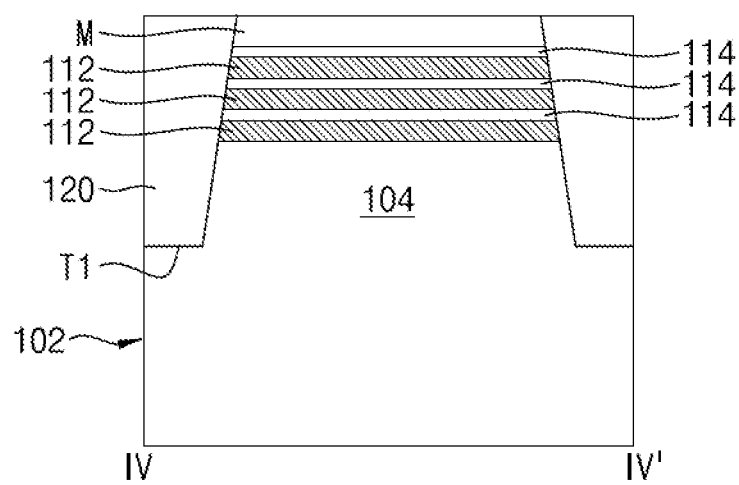
Figure 7A:
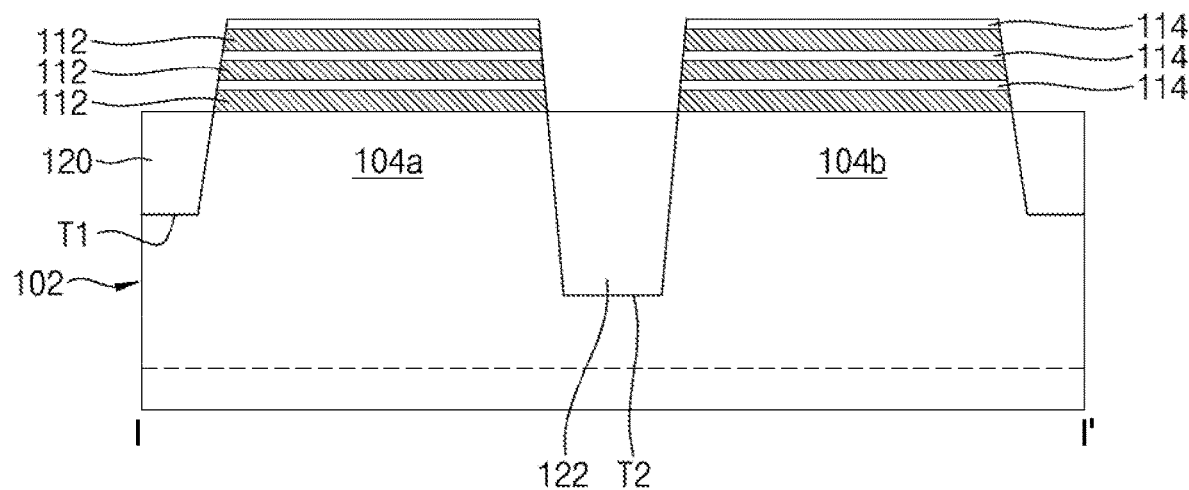
Figure 7B:
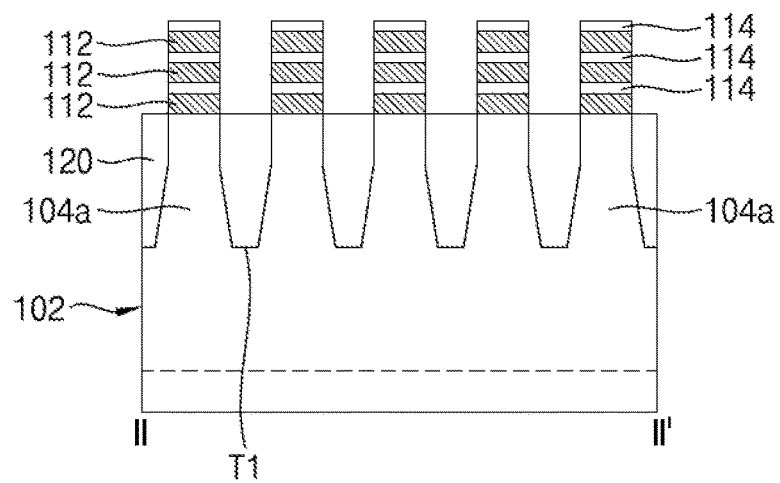
Figure 7C:
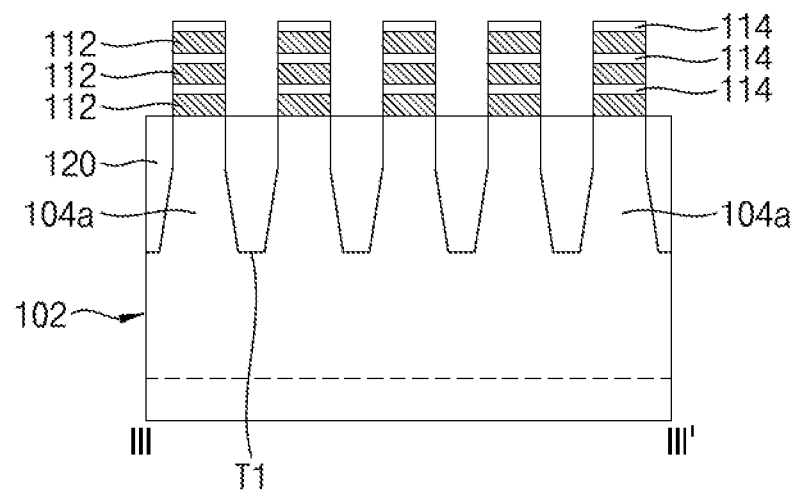
Figure 7D:
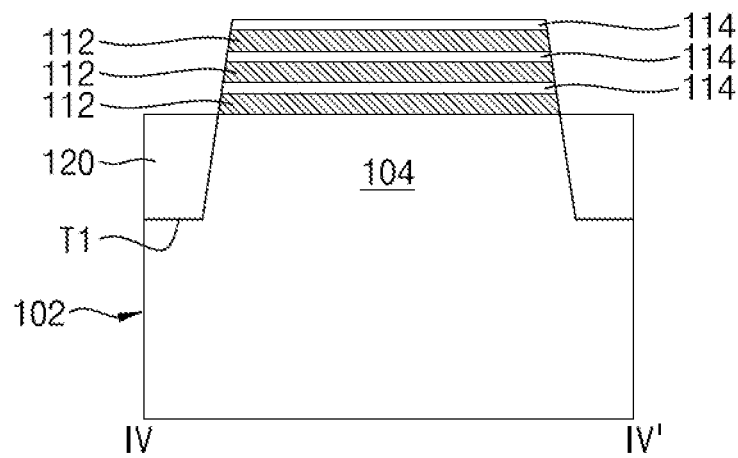
Figure 8A:
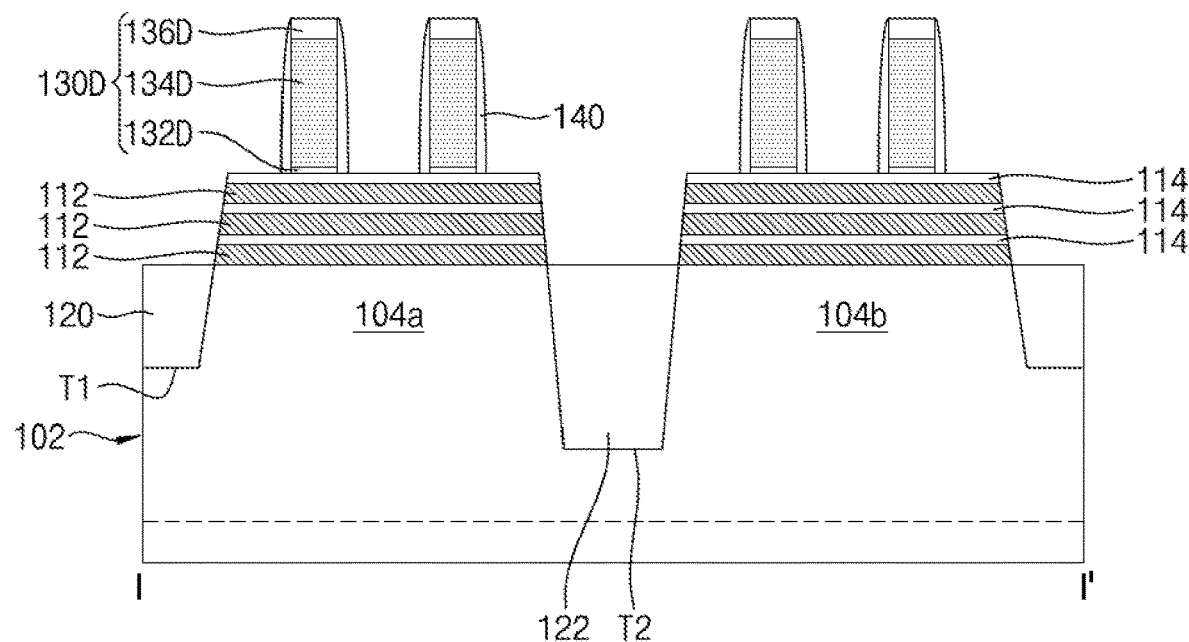
Figure 8B:
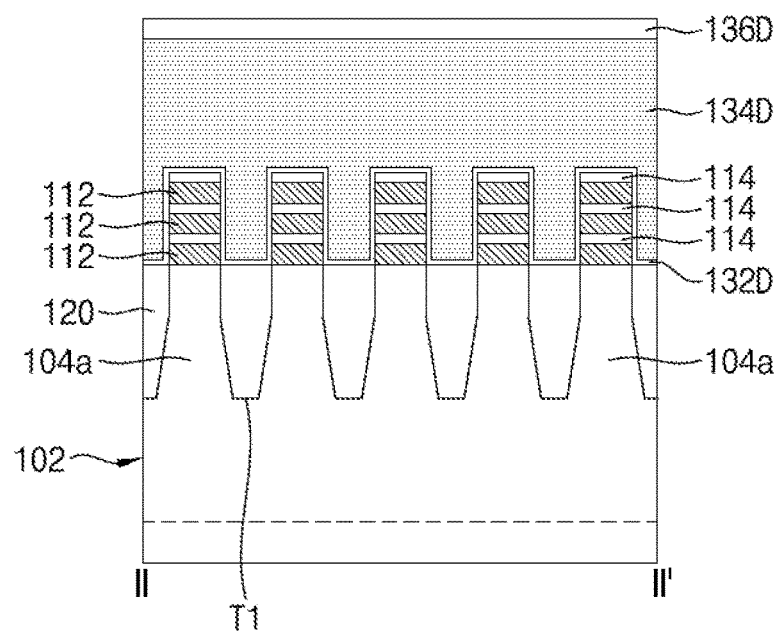
Figure 8C:
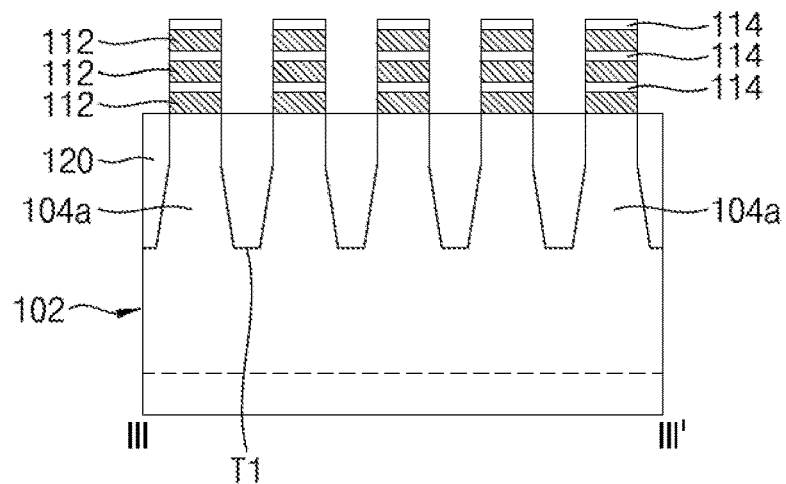
Figure 8D:
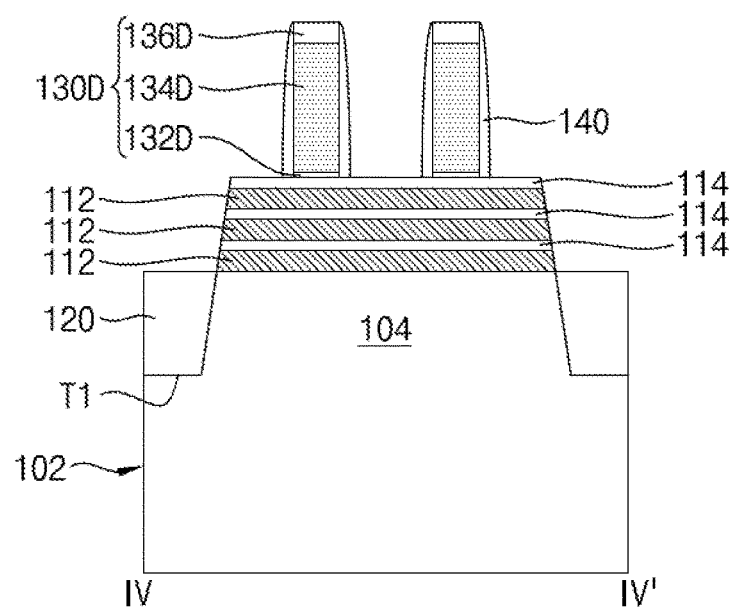

FIG. 3 and FIG. 4 are vertical cross-sectional views of the resistor according to an example embodiment of inventive concepts. FIG. 3 and FIG. 4 are vertical cross-sectional views corresponding to line I-I' of the resistor region of FIG. 1.

Referring to FIG. 3, a semiconductor device 200 may include a buried insulating layer 222 disposed between the first active region 104a and the second active region 104b. The buried insulating layer 222 may fill the inside of the second trench T2 formed on the substrate 102. In an example embodiment, a depth of the second trench T2 may be substantially the same as a depth of the first trench T1. The buried insulating layer 222 may include the same material as the device isolation layer 120. In an example embodiment, the device isolation layer 120 and the buried insulating layer 222 may be shallow trench isolation (STI).

Referring to FIG. 4, a semiconductor device 300 may include a gate dielectric layer 332, a gate electrode 334, and a gate spacer 340. The gate spacer 340 may be on the buried insulating layer 122. The gate electrode 334 and the gate spacer 340 may be disposed in parallel with the gate electrode 134. The gate dielectric layer 332 may cover side and bottom surfaces of the gate electrode 334. Additionally, the gate spacer 340 may cover the side of the gate electrode 334. The gate electrode 334 may be electrically insulated from the N well region NW. In FIG. 4, gate electrode 334 is disposed on the buried insulating layer 122 but is not limited thereto. In an example embodiment, a plurality of gate electrodes 334 may be disposed in parallel with the gate electrode 134 on the buried insulating layer 122. Additionally, although the gate dielectric layer 332 and the gate electrode 334 are disposed inside the gate spacer 340 in FIG. 4, the present disclosure is not limited thereto. In an example embodiment, a dummy gate structure 130D, which will be described later, may be disposed inside the gate spacer 140.

FIGS. 5A-14C are vertical cross-sectional views illustrating in a process order of a method of manufacturing a semiconductor device according to an example embodiment of inventive concepts. FIGS. 5A, 6A, 7A, 8A, 9A, 10A, 11A, 12A, 13A, and 14A are vertical cross-sectional views corresponding to lines I-I' of the resistor region R1 of FIG. 1, respectively. FIGS. 5B, 6B, 7B, 8B, 12B, 13B, and 14B are vertical cross-sectional views corresponding to the line II-II' of the resistor region R1 of FIG. 1, respectively. FIGS. 5C, 6C, 7C, 8C, 9B, 11B, and 12C are vertical sectional views corresponding to line of the resistor region R1 of FIG. 1, respectively. FIGS. 5D, 6D, 7D, 8D, 9C, 10B, 11C, 12D, 13C, and 14C are vertical cross-sectional views corresponding to line IV-IV' of the transistor region R2 of FIG. 1, respectively.

Referring to FIGS. 5A-5D, a stack 110 may be disposed on a substrate 102. The stack 110 may include a plurality of alternately stacked sacrificial layers 112 and channel layers 114. In an example embodiment, the substrate 102 may be a P-type semiconductor substrate and may include an N well region NW on top of a resistor region R1 of the substrate 102. In an example embodiment, the channel layer 114 may include the same material as the substrate 102. The sacrificial layer 112 may be a different material as channel layer 114. For example, the sacrificial layer 112 may include SiGe, and the channel layer 114 may include Si.

Referring to FIGS. 6A-6D, a device isolation layer 120 may be formed. A mask pattern M may be disposed on the stack 110. The mask pattern M may include silicon nitride, polysilicon, spin-on hardmask material, or a combination thereof.

An upper portion of the substrate 102, the sacrificial layer 112, and the channel layer 114 may be partially removed along the mask pattern M to form a first trench T1. The device isolation layer 120 may be formed by filling an insulating material in the first trench T1. The device isolation layer 120 may include silicon oxide, silicon nitride, silicon oxynitride, or a low-K dielectric material. An active region 104 of the substrate 102 may be defined by the device isolation layer 120. The active region 104 may extend in the first horizontal direction D1 and may protrude from the substrate 102. The plurality of active regions 104 may be spaced apart from each other along the second horizontal direction D2.

Referring to FIGS. 7A-7D, a buried insulating layer 122 may be formed to fill the inside of the second trench T2. The upper portion of the substrate 102, the sacrificial layer 112, and the channel layer 114 may be partially removed to form a second trench T2. In an example embodiment, the buried insulating layer 122 may be formed deeper than the device isolation layer 120. The buried insulating layer 122 may be disposed in the middle of the active region 104. The buried insulating layer 122 may divide the active region 104 into a first active region 104a and a second active region 104b. The buried insulating layer 122 may include the same material as the device isolation layer 120. An upper portion of the device isolation layer 120 and the buried insulating layer 122 may be partially etched to expose the sacrificial layer 112 and the channel layer 114.

Referring to FIGS. 8A-8D, a dummy gate structure 130D and a gate spacer 140 may be formed on the stack 110. The dummy gate structure 130D may extend in the second horizontal direction D2 across the active regions 104. The dummy gate structure 130D may include a dummy gate insulating layer 132D, a dummy gate electrode 134D, and a dummy capping layer 136D that are stacked sequentially. The gate spacer 140 may cover side surfaces of the dummy gate structure 130D and may be formed of one or more layers. The gate spacer 140 may be formed by anisotropic etching after depositing an insulating material on the dummy gate structure 130D.

The dummy gate insulating layer 132D may include silicon oxide and may be formed by a method such as chemical vapor deposition (CVD) or atomic layer deposition (ALD). The dummy gate electrode 134D may include polysilicon. The dummy capping layer 136D may include silicon nitride, silicon oxynitride, or a combination thereof. The gate spacer 140 may include silicon nitride, silicon oxynitride, or a combination thereof.

Figure 9A:
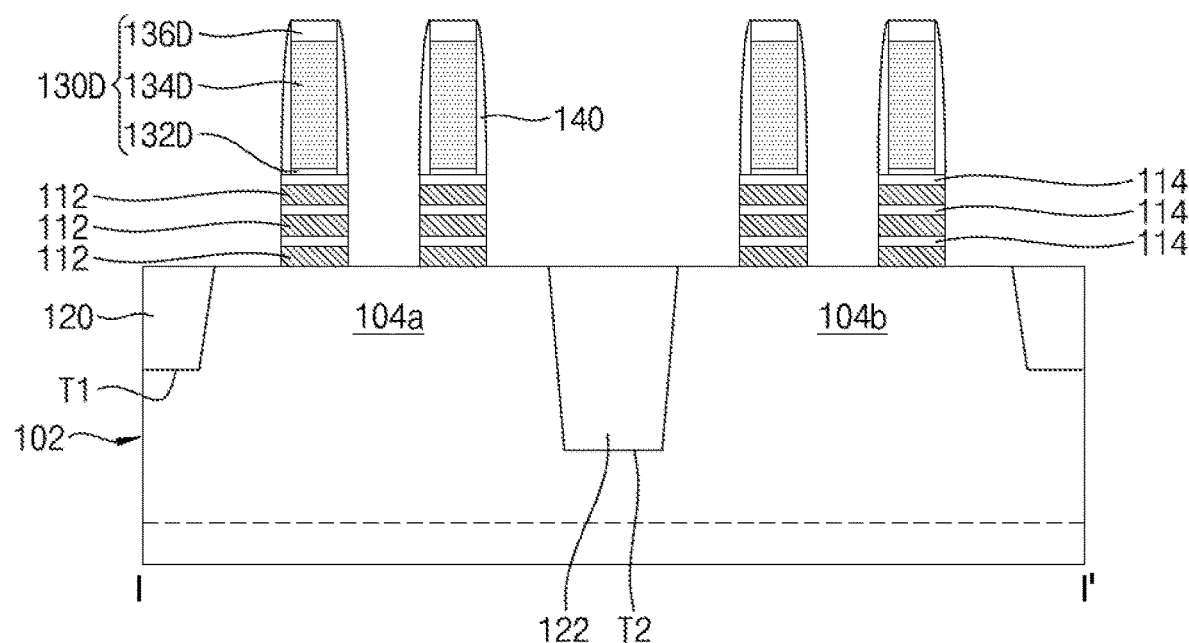
Figure 9B:
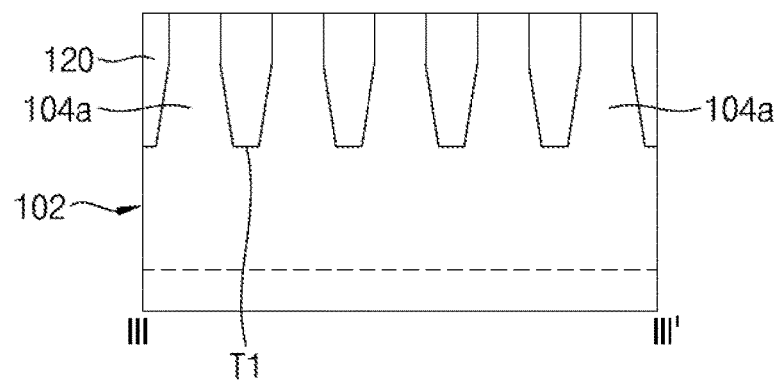
Figure 9C:
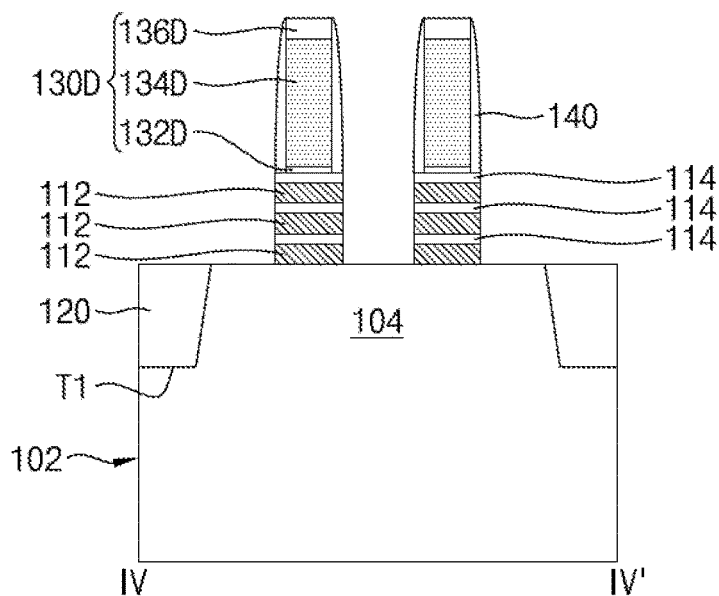

Referring to FIGS. 9A-9C, the sacrificial layer 112 and the channel layer 114 may be removed. The sacrificial layer 112 and the channel layer 114 are not covered by the dummy gate structure 130D. Additionally, the sacrificial layer 112 and the channel layer 114 may be anisotropically etched using the gate spacer 140 as an etching mask. The etching process may expose the active region 104. In an example embodiment, a recess may be formed on top of the active region 104.

Figure 10A:
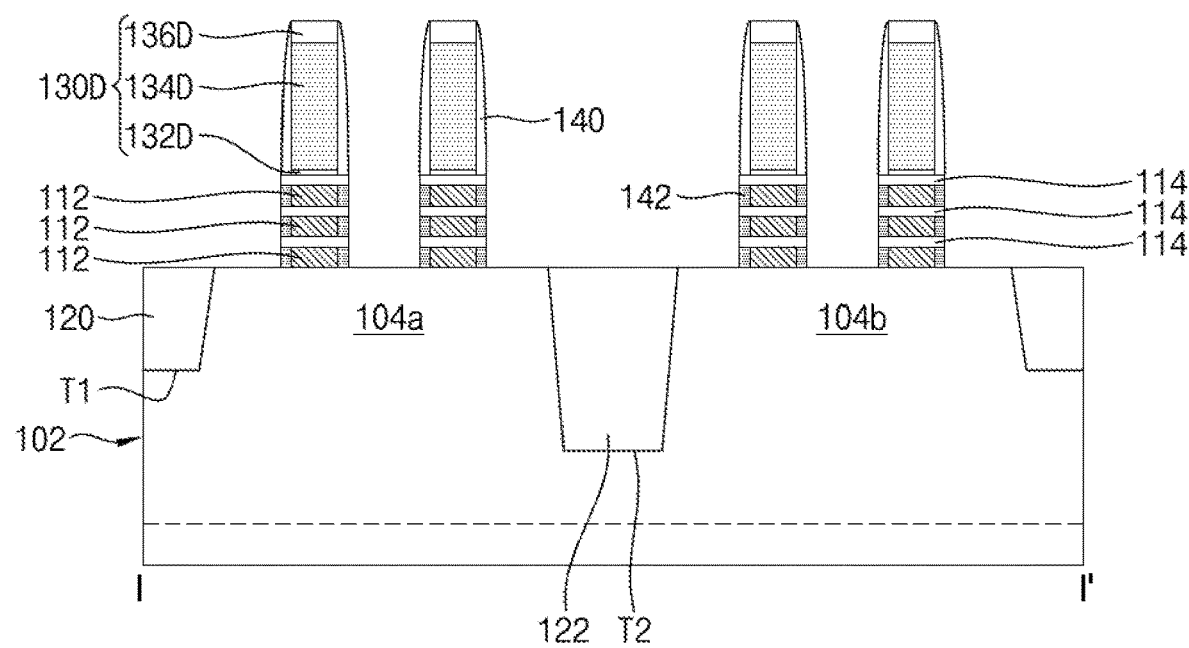
Figure 10B:
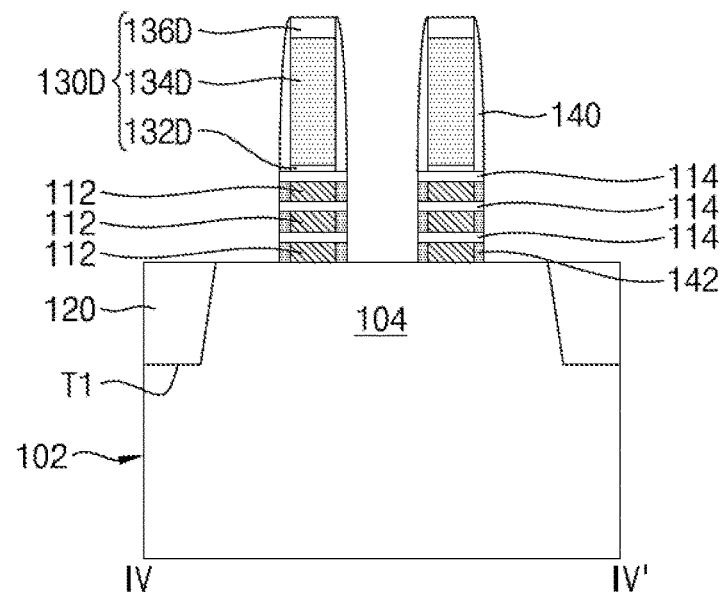

Referring to FIG. 10A and FIG. 10B, an inner spacer 142 may be formed in the space where the sacrificial layer 112 is removed after etching a portion of side surfaces of the sacrificial layer 112. For example, an anisotropic etching process may be performed after forming a recess on the side of the sacrificial layer 112 and depositing an insulating material on the recess. The channel layers 114 may not be etched when forming of the inner spacers 142.

The inner spacers 142 may be formed on side surfaces of the sacrificial layer 112. Additionally, the inner spacers 142 may be disposed between the plurality of channel layers 114 and between the channel layers 114 and the active region 104. An outer surface of the inner spacer 142 may be coplanar with an outer surface of the channel layer 114. The inner spacers 142 may include a silicon nitride material.

Figure 11A:
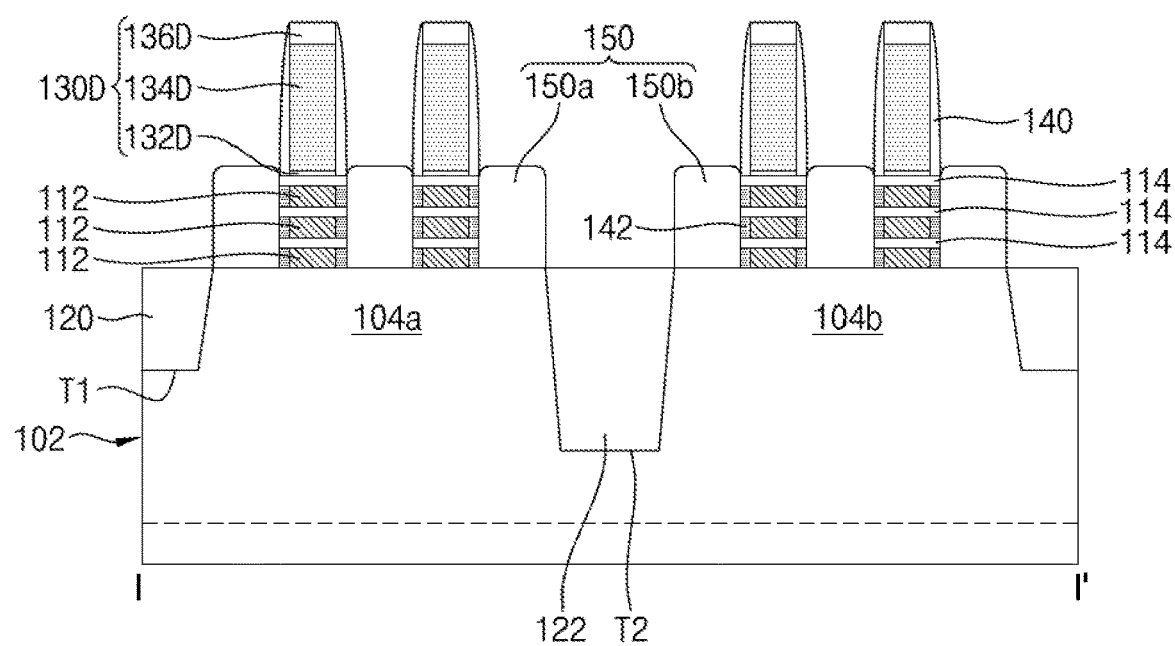
Figure 11B:
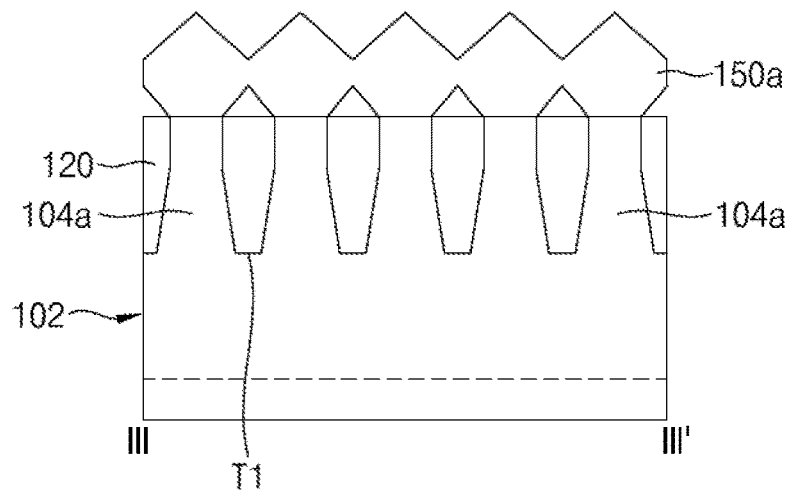
Figure 11C:
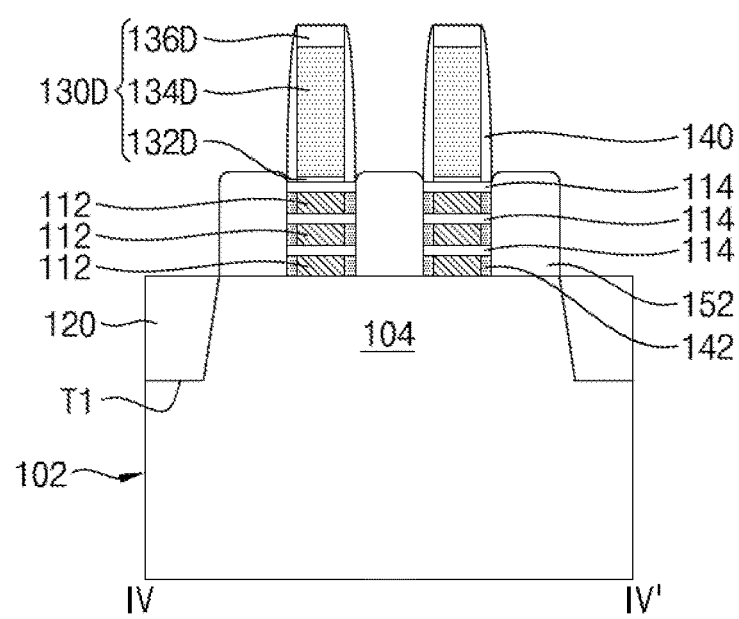
Figure 12A:
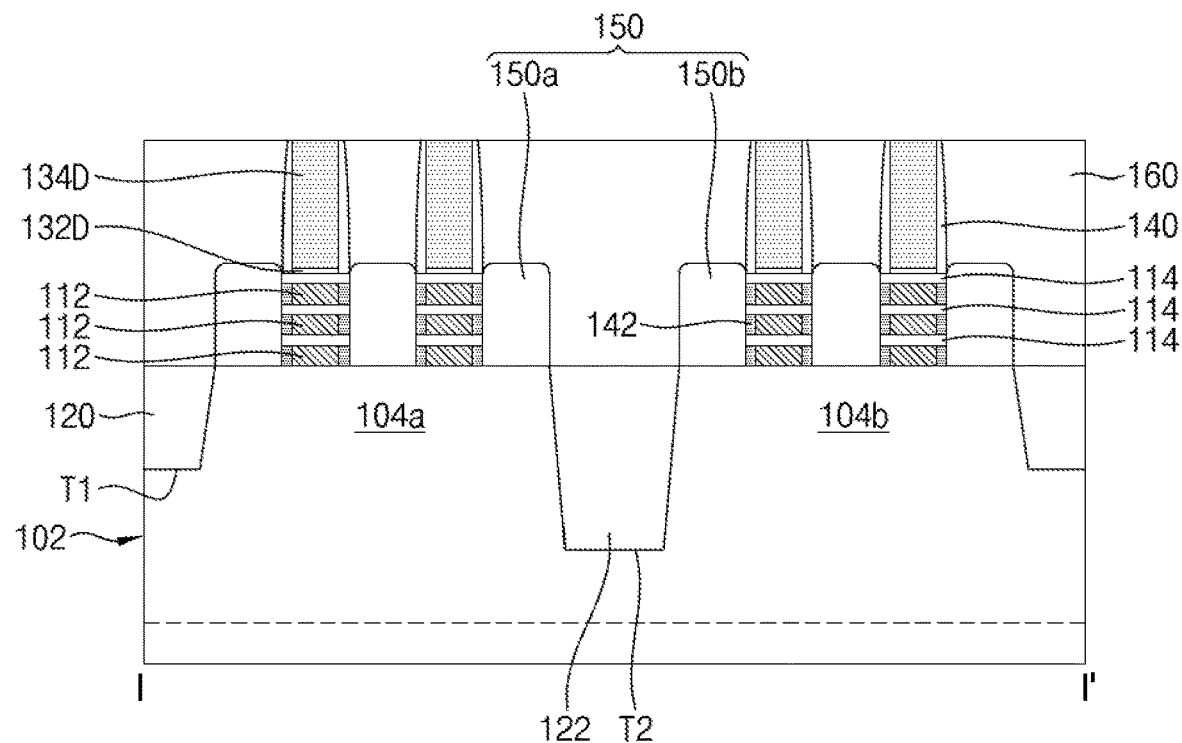
Figure 12B:
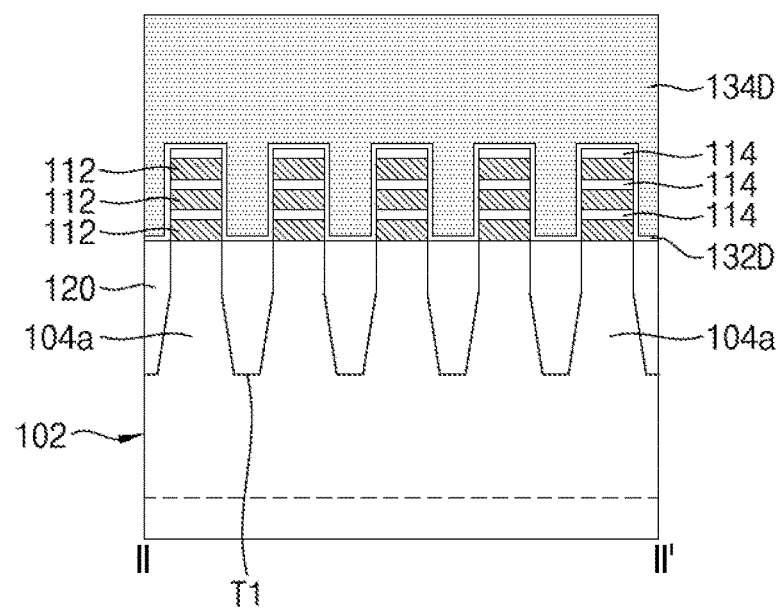
Figure 12C:
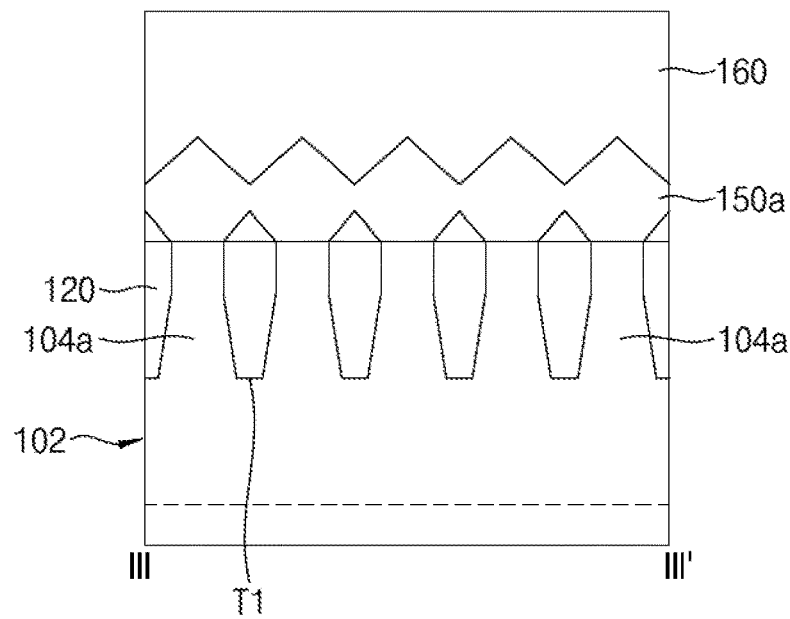
Figure 12D:
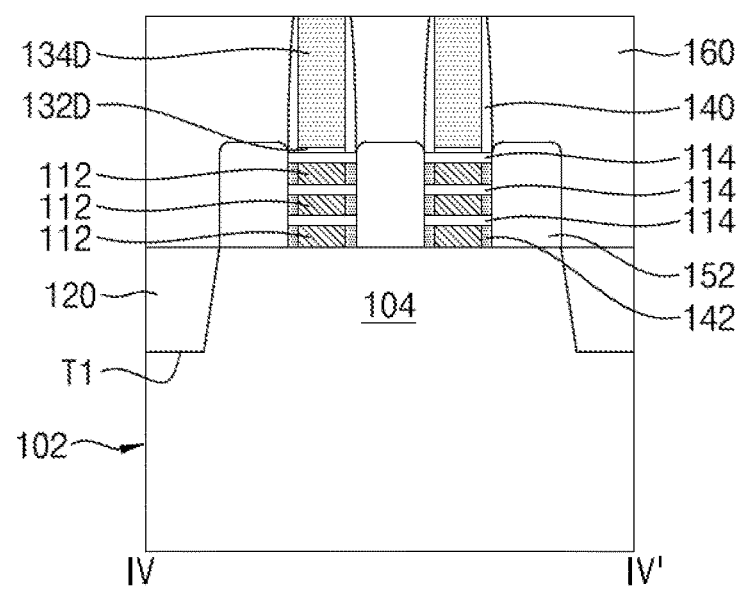

Referring to FIGS. 11A-11C, a doped region 150 may be formed on the side of the dummy gate structure 130D in the resistor region R1. Additionally, a source/drain region 152 may be formed on the side of the dummy gate structure 130D in the transistor region R2.

The doped region 150 and the source/drain region 152 may be formed on the active region 104 along the second horizontal direction D2. The doped region 150 and the source/drain region 152 may be formed by a selective epitaxial growth (SEG) process. Adjacent doped regions 150 may be integrated and adjacent source/drain regions 152 may be integrated. Doped region 150 and source/drain region 152 may each be doped with appropriate ions. In an example embodiment, the doped region 150 and the source/drain region 152 may be doped with n-type impurities. Phosphorus (P), arsenic (As), or the like may be used as the n-type impurities.

Referring to FIGS. 12A-12D, an interlayer insulating layer 160 may be formed and may cover the device isolation layer 120, the buried insulating layer 122, side surface of the gate spacer 140, the doped region 150, and the source/drain region 152. The interlayer insulating layer 160 may fill a space between the doped region 150 and the device isolation layer 120 and between the source/drain region 152 and the device isolation layer 120. The interlayer insulating layer 160 may include silicon oxide, silicon nitride, silicon oxynitride, or a low-K dielectric material. After the interlayer insulating layer 160 is formed, the dummy capping layer 136D may be removed by the planarization process, and a top surface of the dummy gate electrode 134D may be exposed.

Figure 13A:
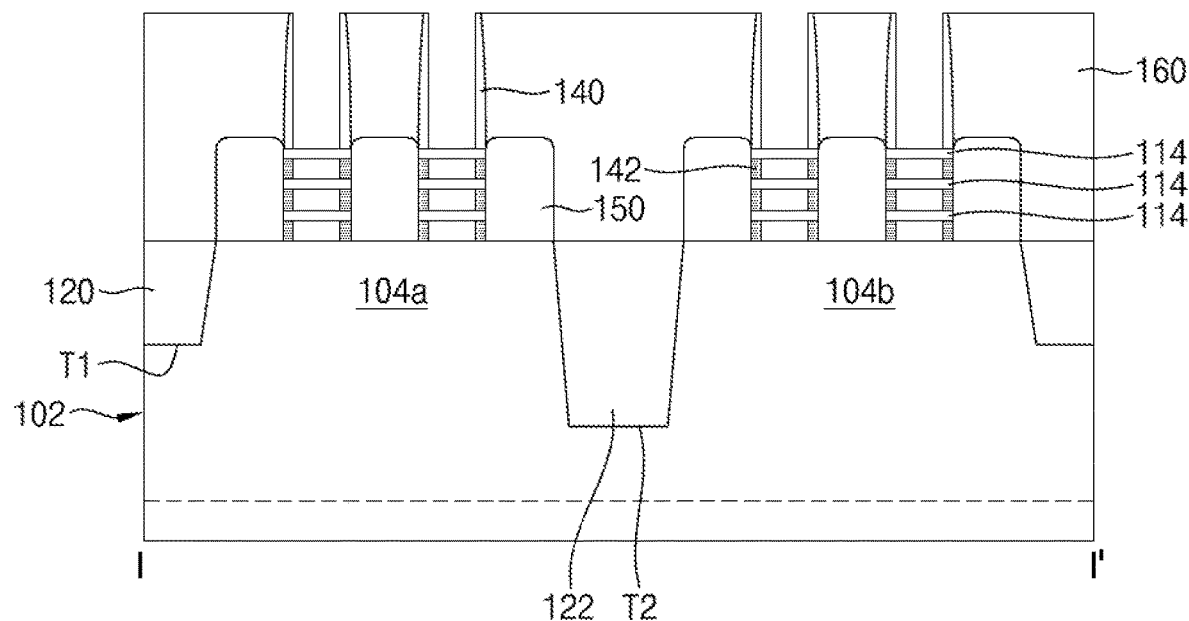
Figure 13B:
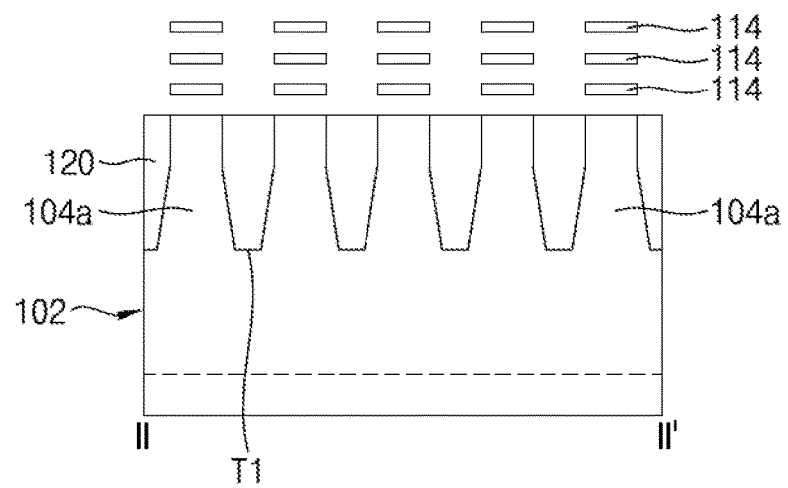
Figure 13C:
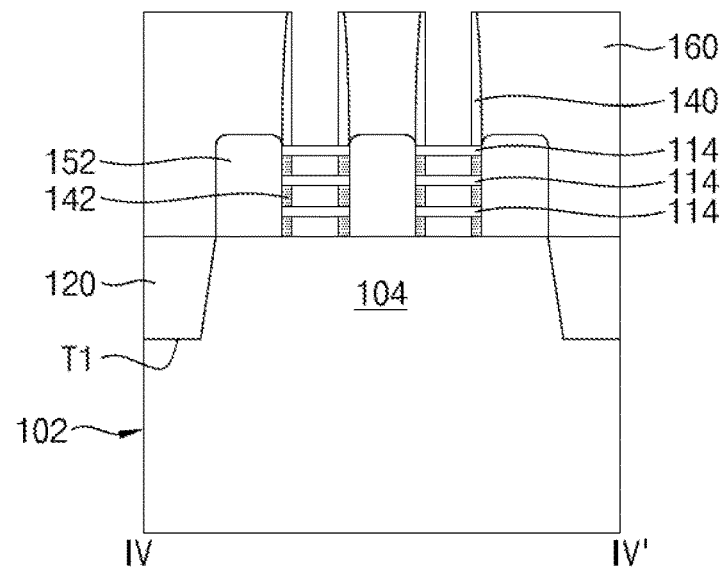

Referring to FIGS. 13A-13C, the dummy gate structure 130D may be removed. The exposed sacrificial layer 112 may be removed by a wet etching process after removing the dummy gate electrode 134D and the dummy gate insulating layer 132D. The gate spacer 140 and the inner spacer 142 may not be removed in the etching process.

Figure 14A:
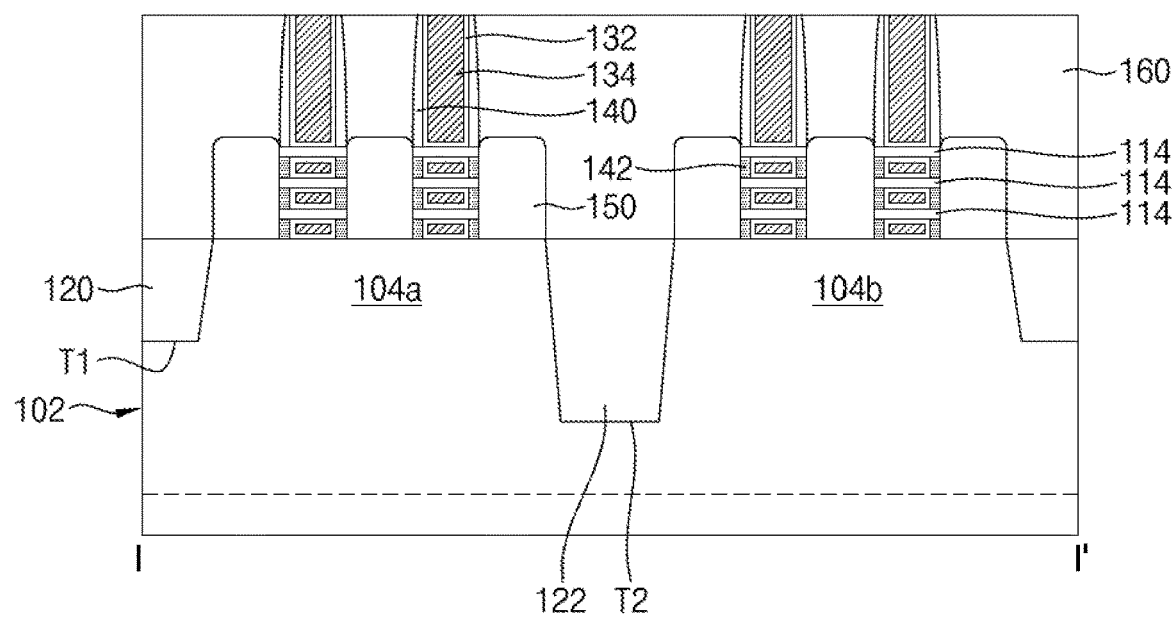
Figure 14B:
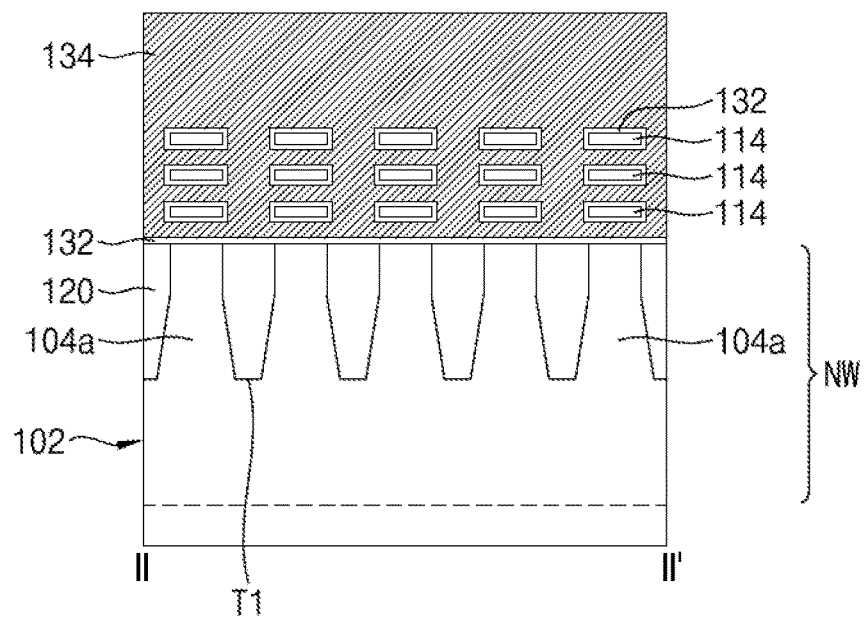
Figure 14C:
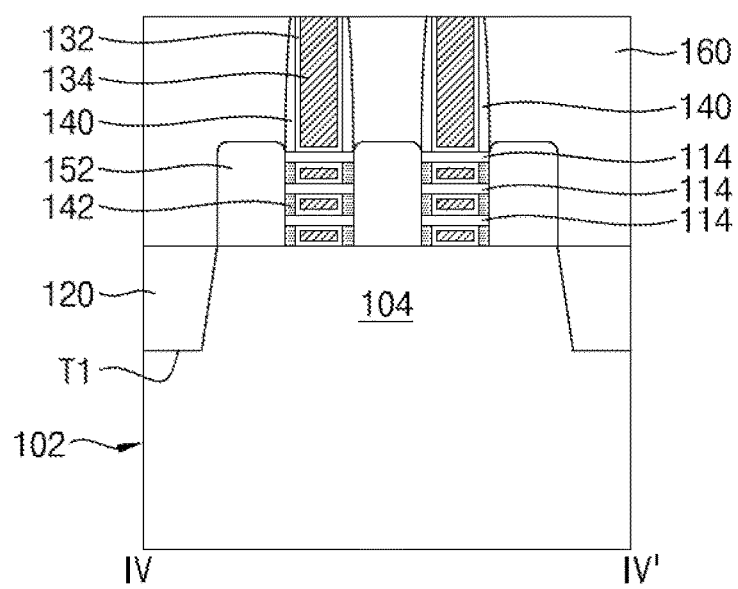

Referring to FIGS. 14A-14C, a gate dielectric layer 132 and a gate electrode 134 may be formed in a space from which the dummy gate insulating layer 132D and the dummy gate electrode 134D are removed. The gate electrode 134 may extend in the first horizontal direction D1. The gate dielectric layer 132 may be formed along surfaces of the device isolation layer 120, the channel layer 114, the gate spacer 140, and the inner spacer 142. The gate electrode 134 may be formed on the gate dielectric layer 132 and may surround the plurality of channel layers 114.

Referring back to FIGS. 2A-2D, a capping layer 170 may be formed to cover top surfaces of the gate electrode 134, the gate spacer 140, and the interlayer insulating layer 160. The capping layer 170 may include silicon oxide, silicon nitride, silicon oxynitride, or a combination thereof.

After the capping layer 170 is formed, a contact plug 180 penetrating the capping layer 170 and the interlayer insulating layer 160 may be formed. The contact plug 180 may be in contact with the top of the doped region 150 and the source/drain region 152. A silicide layer 182 may be formed under the contact plug 180. The silicide layer 182 may be disposed between the doped region 150 and the contact plug 180 and between the source/drain region 152 and the contact plug 180. The contact plug 180 may include W, Co, Cu, Al, Ti, Ta, TiN, TaN, or a combination thereof. The silicide layer 182 may include a material in which a silicon material is applied to portion of the contact plug 180.

A contact insulating layer 184, a via V, and interconnects L1, L2, L3, L4, L5, L6, and L may be formed on the capping layer 170. The contact insulating layer 184 may be disposed on the capping layer 170. The via V and the interconnects L1, L2, L3, L4, L5, L6, and L may pass through the contact insulating layer 184. In an example embodiment, each via V and the interconnects L1, L2, L3, L4, L5, L6, and L may be integrally formed. The contact insulating layer 184 may include silicon oxide. The vias V and the interconnects L1, L2, L3, L4, L5, L6, and L may include W, Co, Cu, Al, or a combination thereof.

While embodiments of inventive concepts have been described with reference to the accompanying drawings, it should be understood by those skilled in the art that various modifications may be made without departing from the scope of inventive concepts and without changing features thereof. Therefore, the above-described embodiments should be considered in a descriptive sense and not for purposes of limitation.

According to example embodiments of inventive concepts, a resistance device with a surrounding gate structure may be implemented.

What is claimed is:

1. A semiconductor device comprising:
   a substrate comprising a first region and a second region;
   an N well region disposed on the first region;
   a first active region and a second active region each extending in a first horizontal direction and disposed in the first region, the first active region and the second active region being spaced apart from each other along the first horizontal direction;
   first gate electrodes disposed in the first region and intersecting the first active region and the second active region, the first gate electrodes extending along a second horizontal direction intersecting with the first horizontal direction;
   a buried insulating layer disposed between the first active region and the second active region, the buried insulating layer disposed between corresponding two of the first gate electrodes;
   a third active region extending in the first horizontal direction and disposed in the second region; and
   second gate electrodes disposed in the second region and intersecting the third active region, the second gate electrodes extending along the second horizontal direction.

2. The semiconductor device according to claim 1, wherein the buried insulating layer extending along the second horizontal direction.

3. The semiconductor device according to claim 1, wherein a distance between the two corresponding first gate electrodes is greater than a distance between adjacent first gate electrodes.

4. The semiconductor device according to claim 1, further comprising a first doped region and a second doped region each disposed on side surfaces of the first gate electrodes on the first active region and the second active region, the first doped region and the second doped region in contact with the N well region and including n impurities.

5. The semiconductor device according to claim 4, further comprising a plurality of contact plugs in contact with upper surfaces of the first doped region and the second doped region.

6. The semiconductor device according to claim 4, wherein doping concentrations of the first doped region and the second doped region are higher than a doping concentration of the N well region.

7. The semiconductor device according to claim 5, further comprising silicide layers between the first doped region and the plurality of the contact plugs.

8. The semiconductor device according to claim 4, wherein the first doped region and the second doped region are semiconductor layers epitaxially grown from the first active region and the second active region.

9. The semiconductor device according to claim 5, wherein each of the plurality of the contact plugs extends along the second horizontal direction and has a bar shape.

10. The semiconductor device according to claim 4, wherein the first doped region is electrically connected with the second doped region through the first active region, the N well region, and the second active region.

11. A semiconductor device comprising:
    a substrate comprising a first region and a second region;
    an N well region disposed on the first region;
    a first active region and a second active region each extending in a first horizontal direction and disposed in the first region, the first active region and the second active region being spaced apart from each other along the first horizontal direction;
    a first device isolation layer contacting the first active region and the second active region;
    a plurality of first channel layers stacked on the first active region and the second active region, the plurality of first channel layers being spaced apart from each other in a vertical direction;
    first gate electrodes disposed in the first region and surrounding the plurality of first channel layers on at least two opposite sides, the first gate electrodes extending along a second horizontal direction intersecting with the first horizontal direction;
    a buried insulating layer disposed between the first active region and the second active region, the buried insulating layer disposed between corresponding two of the first gate electrodes; and
    a third active region extending in the first horizontal direction and disposed in the second region.

12. The semiconductor device according to claim 11, further comprising:

a first doped region and a second doped region each disposed on side surfaces of the first gate electrodes on the first active region and the second active region, the first doped region and the second doped region in contact with the N well region and including n impurities;

a plurality of contact plugs in contact with upper surfaces of the first doped region and the second doped region.

13. The semiconductor device according to claim 12, further comprising:

a second device isolation layer disposed in the second region and defining the third active region extending along the first horizontal direction;

a plurality of second channel layers stacked spaced apart from each other in the vertical direction on the third active region;

second gate electrodes surrounding the plurality of the second channel layers on at least two opposite sides and extending along the second horizontal direction;

a source/drain region disposed on side surfaces of the second gate electrodes on the third active region.

14. The semiconductor device according to claim 13, wherein the source/drain region has a conductivity type different from a conductivity type of the third active region.

15. The semiconductor device according to claim 13, further comprising first inner spacers in contact with a side surface of the first doped region or the second doped region and disposed on lower surfaces of the plurality of first channel layers, and second inner spacers in contact with a side surface of the source/drain region and disposed on lower surfaces of the plurality of the second channel layers.

16. The semiconductor device according to claim 13, wherein the source/drain region is a semiconductor layer epitaxially grown from the third active region.

17. A semiconductor device comprising:

a substrate comprising a first region and a second region;

an N well region disposed on the first region;

a first active region and a second active region each extending in a first horizontal direction and disposed in the first region, the first active region and the second active region being spaced apart from each other along the first horizontal direction;

a plurality of first channel layers stacked on the first active region and the second active region, the plurality of first channel layers being spaced apart from each other in a vertical direction;

first gate electrodes disposed in the first region and surrounding the plurality of first channel layers on at least two opposite sides, the first gate electrodes extending along a second horizontal direction intersecting with the first horizontal direction;

a buried insulating layer disposed between the first active region and the second active region, the buried insulating layer disposed between corresponding two of the first gate electrodes; and a second gate electrode disposed on the buried insulating layer and extending along the second horizontal direction, wherein each of the first gate electrodes includes a first upper electrode on the plurality of first channel layers and a first lower electrode below the first upper electrode and separated by the plurality of first channel layers, and wherein a lower surface of the first upper electrode is at a higher level than a lower surface of the second gate electrode.

18. The semiconductor device according to claim 17, further comprising a gate dielectric layer covering side surfaces and the lower surface of the second gate electrode, wherein the gate dielectric layer contacts an upper surface of the buried insulating layer.

19. The semiconductor device according to claim 17, wherein the second gate electrode is a dummy gate electrode.

20. The semiconductor device according to claim 17, wherein an upper surface of the first upper electrode is at a same level as an upper surface of the second gate electrode.

* * * * *